United States Patent
Kim et al.

(10) Patent No.: US 11,302,384 B2
(45) Date of Patent: Apr. 12, 2022

(54) METHOD OF CONTROLLING ON-DIE TERMINATION AND MEMORY SYSTEM PERFORMING THE SAME

(71) Applicant: SAMSUNG ELECTRONICS CO., LTD., Suwon-si (KR)

(72) Inventors: Chulung Kim, Seoul (KR); Joungyeal Kim, Yongin-si (KR); Seongheon Yu, Suwon-si (KR); Hyunjin Ko, Yongin-si (KR); Wooil Kim, Yongin-si (KR); Hyeonsoo Sim, Uijeongbu-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 0 days.

(21) Appl. No.: 16/931,933

(22) Filed: Jul. 17, 2020

(65) Prior Publication Data

US 2021/0174861 A1     Jun. 10, 2021

(30) Foreign Application Priority Data

Dec. 5, 2019     (KR) .................. 10-2019-0160408

(51) Int. Cl.
*G11C 11/4093*     (2006.01)
*G11C 11/4096*     (2006.01)
*G06F 13/40*     (2006.01)
*G06F 13/16*     (2006.01)
(Continued)

(52) U.S. Cl.
CPC ...... *G11C 11/4093* (2013.01); *G06F 13/1668* (2013.01); *G06F 13/4086* (2013.01); *G11C 11/4096* (2013.01); *H01L 25/0657* (2013.01); *H01L 25/18* (2013.01); *H01L 2225/06513* (2013.01); *H01L 2225/06517* (2013.01); *H01L 2225/06541* (2013.01)

(58) Field of Classification Search
None
See application file for complete search history.

(56) References Cited

U.S. PATENT DOCUMENTS

| 7,449,914 | B2 | 11/2008 | Kim et al. |
| 8,243,534 | B2 | 8/2012 | Fujisawa |
| 8,619,492 | B2 | 12/2013 | Jeon |

(Continued)

FOREIGN PATENT DOCUMENTS

| KR | 10-2007-0081881 | 8/2007 |
| KR | 10-2009-0090004 | 8/2009 |
| KR | 10-2018-0113520 | 10/2018 |

*Primary Examiner* — Amy Cohen Johnson
*Assistant Examiner* — James H Cho
(74) *Attorney, Agent, or Firm* — F. Chau & Associates, LLC

(57) ABSTRACT

In a method of controlling on-die termination (ODT) in a memory system including a plurality of memory units that shares a data bus to transfer data, ODT circuits of the plurality of memory units are enabled into an initial state, a resistance value of the ODT circuit is set to a first resistance value, of at least one write non-target memory unit among the plurality of memory units during a write operation on a write target memory unit among the plurality of memory units, and a resistance value of the ODT circuit is set to a second resistance value, of at least one read non-target memory unit among the plurality of memory units during a read operation on a read target memory unit among the plurality of memory units.

19 Claims, 29 Drawing Sheets

(51) Int. Cl.
*H01L 25/065* (2006.01)
*H01L 25/18* (2006.01)

(56) References Cited

U.S. PATENT DOCUMENTS

| | | | |
|---|---|---|---|
| 9,385,719 B2* | 7/2016 | Shaeffer | H03K 19/017545 |
| 10,089,040 B2 | 10/2018 | Oh et al. | |
| 2012/0272013 A1* | 10/2012 | Liou | G06F 13/1647 |
| | | | 711/150 |
| 2016/0028395 A1* | 1/2016 | Bains | H03K 19/0008 |
| | | | 326/30 |
| 2018/0342274 A1* | 11/2018 | Son | G11C 7/1051 |
| 2020/0204179 A1* | 6/2020 | Lee | G11C 7/1084 |

\* cited by examiner

FIG. 3
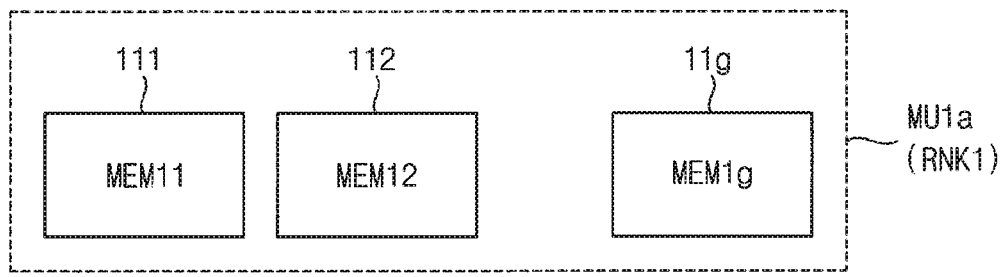
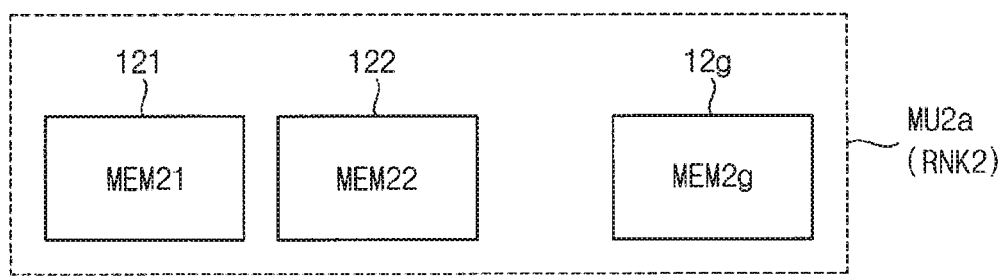

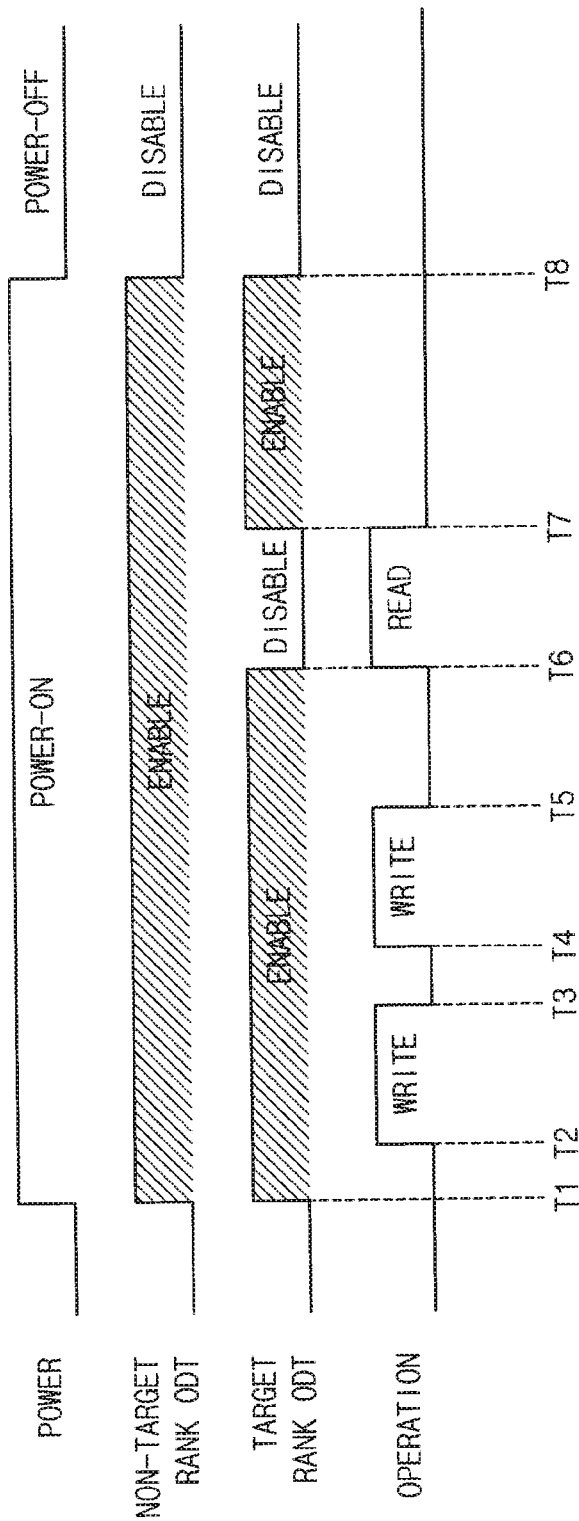

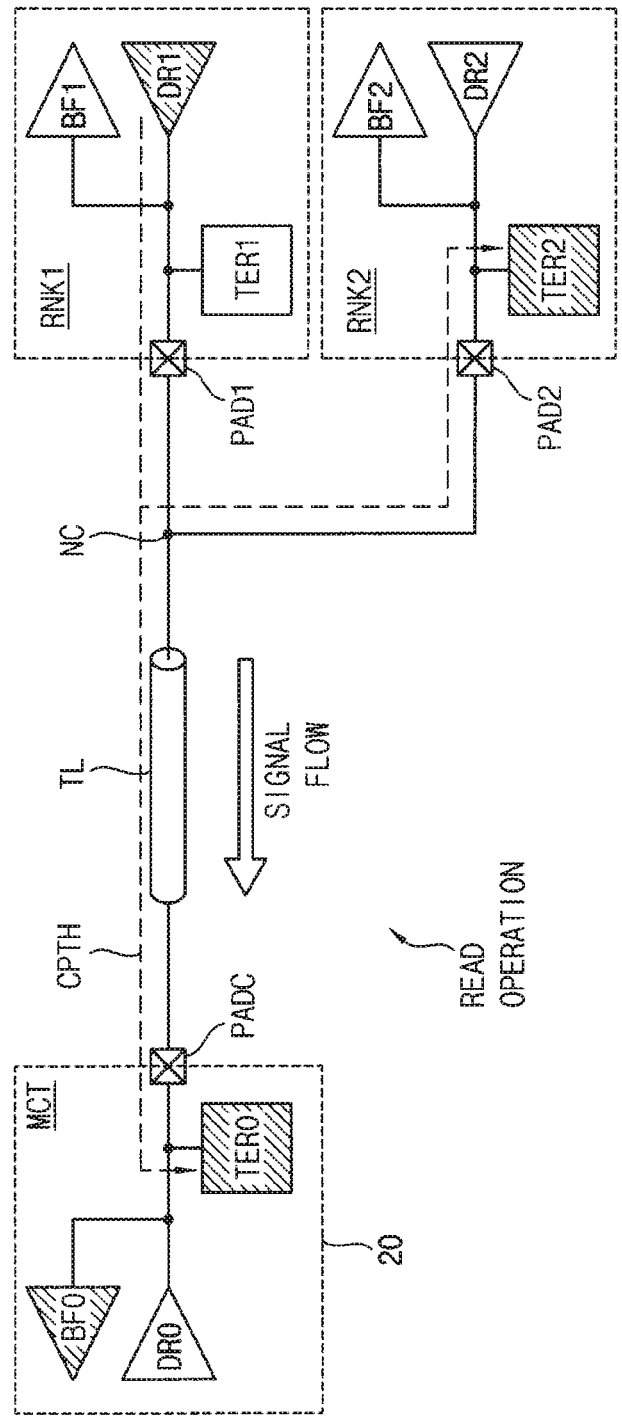

FIG. 15

|  | RNK_TG | RNK_NT | MC |
|---|---|---|---|
| READ | DISABLED | Rtt2 | Rtt |
| WRITE | Rtt | Rtt1 | DISABLED |

FIG. 19A

| MRSET (MR11) | OP7 | OP6 | OP5 | OP4 | OP3 | OP2 | OP1 | OP0 |
|---|---|---|---|---|---|---|---|---|
| | RFU | CA ODT | | | 'H' 'L' OR | ODT | | |

FIG 19B

| MRSET (MR41) | OP7 | OP6 | OP5 | OP4 | OP3 | OP2 | OP1 | OP0 |
|---|---|---|---|---|---|---|---|---|
| | NT-ODT | | | PPRE | RFU | | | |

| OP[7:5] | RTT |
|---|---|
| 001 | RZQ/1 |
| 010 | RZQ/2 |
| 011 | RZQ/3 |
| 100 | RZQ/4 |
| 101 | RZQ/5 |
| 110 | RZQ/6 |

METHOD OF CONTROLLING ON-DIE TERMINATION AND MEMORY SYSTEM PERFORMING THE SAME

CROSS-REFERENCE TO RELATED APPLICATION

This U.S. Non-provisional application claims priority under 35 USC § 119 to Korean Patent Application No. 10-2019-0160408, filed on Dec. 5, 2019, in the Korean Intellectual Property Office (KIPO), the disclosure of which is incorporated by reference in its entirety herein.

BACKGROUND

1. Technical Field

Example embodiments relate generally to semiconductor integrated circuits, and more particularly to a method of controlling on-die termination and a memory system performing the method.

2. Discussion of Related Art

On-die termination (ODT) is a technology where a termination resistor for impedance matching in transmission lines is located inside a semiconductor chip instead on a printed circuit board. ODT may be introduced to enhance signal integrity by reducing signal reflection between a transmitter and a receiver. An ODT circuit may reduce the signal reflection by providing a termination resistance that is matched with an impedance of a transmission line. However, when ODT is implemented to enhance signal integrity of signals transmitted across the transmission lines, power consumption may be increased.

SUMMARY

At least one exemplary embodiment of the inventive concept provides a method of controlling an ODT that is capable of enhancing performance and signal integrity.

At least one exemplary embodiment of the inventive concept provides a memory system that is capable of enhancing performance and signal integrity.

According to an exemplary embodiment of the inventive concept, in a method of controlling on-die termination (ODT) in a memory system including a plurality of memory units that shares a data bus to exchange data, ODT circuits of the plurality of memory units are enabled into an initial state, a resistance value of the ODT circuit of a non-target memory unit among the plurality of memory units is set to a first resistance value during a write operation on a target memory unit among the plurality of memory units, and a resistance value of the ODT circuit of a read non-target memory unit among the plurality of memory units is set to a second resistance value during a read operation on a read target memory unit among the plurality of memory units.

According to an exemplary embodiment of the inventive concept, a memory system includes a plurality of memory ranks and a memory controller to control the plurality of memory ranks. The plurality of memory ranks share a data bus and a command/address bus. On die termination (ODT) circuits of the plurality of memory ranks are enabled into an initial state. A resistance value of the ODT circuit of ae non-target memory rank among the plurality of memory ranks is to a first resistance value during a write operation on a target memory rank among the plurality of memory ranks. A resistance value of the ODT circuit of a non-target memory rank among the plurality of memory ranks is set to a second resistance value during a read operation on a read target memory rank among the plurality of memory ranks.

According to an exemplary embodiment of the inventive concept, a memory system includes a first memory rank and a second memory rank sharing a data bus and a command/address bus and a memory controller to control the first memory rank and the second memory rank. The first memory rank includes a first dynamic random access memory (DRAM) chip and the second memory rank includes a second DRAM chip. On die termination (ODT) circuits of the first and second DRAM chips are enabled into an initial state. A resistance value of the ODT circuit of the second DRAM chip corresponding to a write non-target of the first and second DRAM chips is to a first resistance value during a write operation on the first DRAM chip correspond to a write target of the first and second DRAM chips. A resistance value of the ODT circuit of the second DRAM chip is set to a second resistance value different from the first resistance value during a read operation on the first DRAM chip.

According to an exemplary embodiment of the inventive concept, a memory system includes a first memory device, a second memory device, and a memory controller configured to control the first and second memory devices. The memory controller is configured to enable the ODT circuits and set a resistance value of the ODT circuits to a first resistance value during a write operation, and disable the first ODT circuit and set a resistance value of the second ODT circuit to a second resistance value during a read operation of the first memory device. The first and second resistance values are the same as one another when the memory system is operating in a first mode and different from one another when the memory system is operating in a second other mode.

A method of controlling ODT and a memory system performing the method according to at least one exemplary embodiment of the inventive concept may enhance performance and signal integrity through static ODT control by setting a resistance value of the ODT circuit in the non-target memory rank differently in a write operation and a read operation.

BRIEF DESCRIPTION OF THE DRAWINGS

Exemplary embodiments of the present inventive concept will be more clearly understood from the following detailed description taken in conjunction with the accompanying drawings.

FIG. 3 illustrates an example of a memory sub system in FIG. 1 according to an exemplary embodiment of the inventive concept.

FIG. 6 is a timing diagram illustrating a method of controlling ODT according to an exemplary embodiment of the inventive concept.

FIGS. 13 and 14 are diagrams illustrating a method of controlling ODT in a read operation according to an exemplary embodiment of the inventive concept.

FIG. 15 is a diagram illustrating an example of a resistance setting used in a method of controlling ODT according to an exemplary embodiment of the inventive concept.

FIGS. 19A and 19B are diagrams for describing a mode register for ODT according to an exemplary embodiment of the inventive concept.

DETAILED DESCRIPTION OF THE EXEMPLARY EMBODIMENTS

Figure 1:
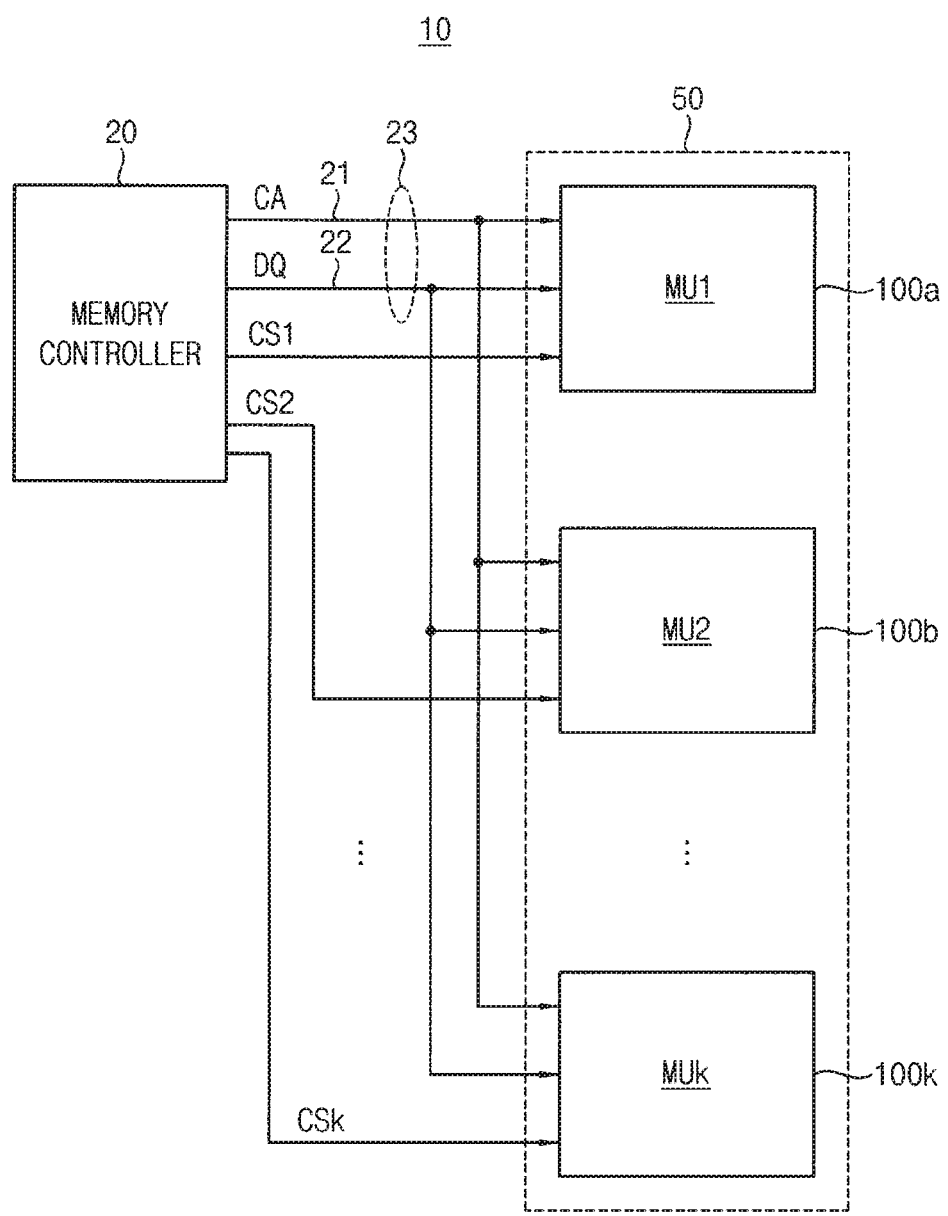
FIG. 1 is a block diagram illustrating a memory system according to an exemplary embodiment of the inventive concept.

The inventive concept will be described more fully hereinafter with reference to the accompanying drawings, in which some exemplary embodiments of the inventive concept are shown. In the drawings, like numerals refer to like elements throughout.

FIG. 1 is a block diagram illustrating a memory system according to an exemplary embodiment of the inventive concept.

Referring to FIG. 1, a memory system 10 includes a memory controller 20 (e.g., a control circuit) and a memory sub system 50.

The memory sub system 50 may include a plurality of memory units (MU1, MU2, . . . , MUk) 100a, 100b, . . . , 100k. Here, k is an integer greater than two. For example, each memory unit could be a memory device, a memory card, or a memory chip.

The plurality of memory units 100a, 100b, . . . , 100k may share a data bus 22 to transfer data DQ and a command/address (CA) bus 21 to transfer a command and an address CA and may receive a respective one of chip selection signals CS1, CS2, . . . , CSk. The CA bus 21 and the data bus 22 may constitute one channel 23. For example, the commands could include a read command, a write command, an erase command, etc.

In an exemplary embodiment, the plurality of memory units 100a, 100b, . . . , 100k include a respective one of a plurality of memory ranks which are individually selected based on the plurality of chip selection signals CS1, CS2, . . . , CSk, respectively. In an exemplary embodiment, the plurality of memory units 100a, 100b, . . . , 100k include a respective one a plurality of memory chips in the respective one of the plurality of memory ranks which are individually selected based on the plurality of chip selection signals CS1, CS2, . . . , CSk, respectively.

A memory unit of the plurality of memory units 100a, 100b, . . . , 100k, which is selected by one of the chip selection signals CS1, CS2, . . . , CSk, having a first logic level, is referred to as a target memory unit, and at least one memory unit of the plurality of memory units 100a, 100b, . . . , 100k, which is unselected by one of the chip selection signals CS1, CS2, . . . , CSk, having a second logic level, is referred to as a non-target memory unit. For example, when a write operation is to be performed on a given one of the memory units, the given memory unit may be referred to as the target memory unit and the other memory units may be referred to as the non-target memory unit.

Figure 2:
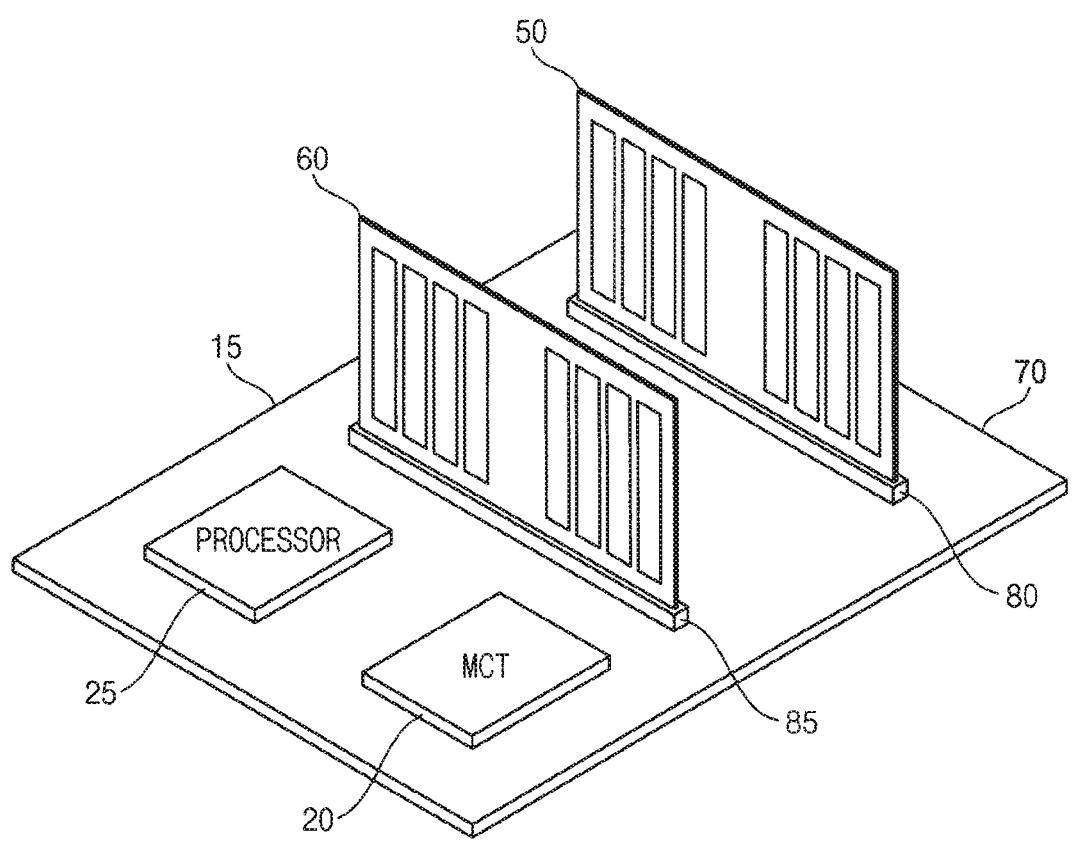
FIG. 2 is a block diagram illustrating a semiconductor system including the memory system of FIG. 1 according to an exemplary embodiment of the inventive concept.

FIG. 2 is a block diagram illustrating a semiconductor system including the memory system of FIG. 1 according to an exemplary embodiment of the inventive concept.

Referring to FIG. 2, a semiconductor (memory) system 15 includes sockets 80 and 85, the memory controller (MCT) 20, a processor 25 and a substrate 70.

The sockets 80 and 85, the memory controller 20 and the processor 25 may be attached on the substrate 70 and may be electrically connected to each other via an electric conductor included in the substrate 70. A memory sub system 50 may be installed in the semiconductor system 15 via the socket 80 and a memory sub system 60 may be installed in the semiconductor system 15 via the socket 85.

In some embodiments, the semiconductor system 15 may be a main board or a computing system on which the memory sub systems 50 and 60 is provided, and the memory sub systems 50 and 60 may function as data memory in the semiconductor system 15. The memory sub systems 50 and 60 may be memory modules and may include two memory units which are individually selected based on two chip selection signals, respectively.

FIG. 3 illustrates an example of the memory sub system in FIG. 1 according to an exemplary embodiment of the inventive concept.

Referring to FIG. 3, a memory sub system 50a includes a first memory unit MU1a and a second memory unit MU2a.

The first memory unit MU1a may correspond to a first memory rank RNK1 and may include a plurality of first memory chips (MEM11, MEM12, ... MEM1g) 111, 112, ..., 11g. The second memory unit MU2a may correspond to a second memory rank RNK2 and may include a plurality of second memory chips (MEM21, MEM22, ... MEM2g) 121, 122, ..., 12g. Here g is an integer greater than two.

Figure 4:
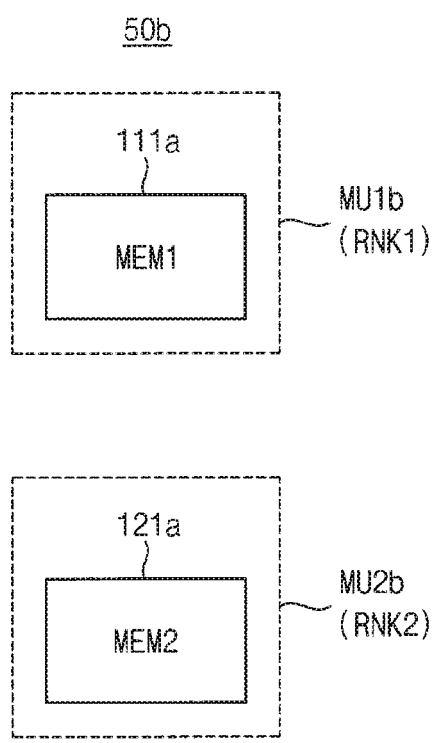
FIG. 4 illustrates an example of the memory sub system in FIG. 1 according to an exemplary embodiment of the inventive concept.

FIG. 4 illustrates an example of the memory sub system in FIG. 1 according to an exemplary embodiment of the inventive concept.

Referring to FIG. 4, a memory sub system 50b may include a first memory unit MU1b and a second memory unit MU2b.

The first memory unit MU1b may correspond to a first memory rank RNK1 and include a first memory chip 111a. The second memory unit MU2b may correspond to a second memory rank RNK2 and include a second memory chip 121a.

According to an exemplary embodiment of the inventive concept, each of the plurality of memory units corresponds to a respective one of a plurality of memory ranks which are selected based on chip selection signals, respectively and each of the memory units may include at least one memory chip. The at least one memory chip may be a dynamic random access memory (DRAM) chip or a nonvolatile memory chip.

Figure 5:
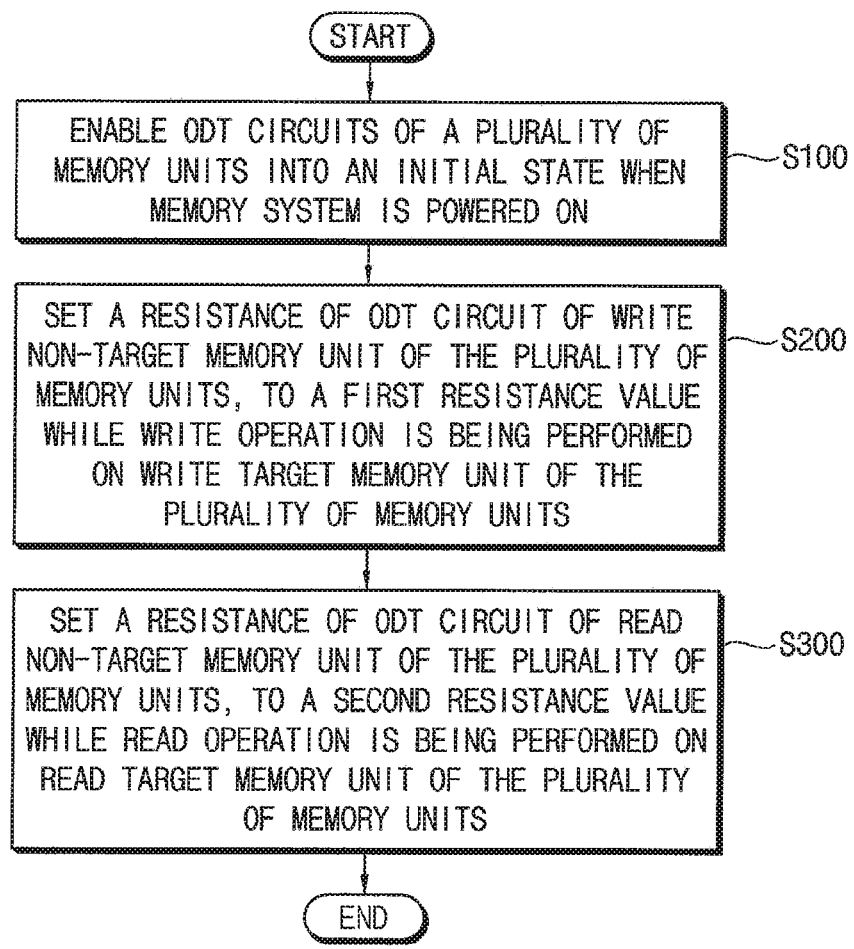
FIG. 5 is a flow chart illustrating a method of controlling on-die termination (ODT) according to an exemplary embodiment of the inventive concept.

FIG. 5 is a flow chart illustrating a method of controlling on-die termination (ODT) according to an exemplary embodiment of the inventive concept and FIG. 6 is a timing diagram illustrating a method of controlling ODT according to an exemplary embodiment of the inventive concept.

Referring to FIGS. 1, 5 and 6, ODT circuits of the plurality memory units 100a, 100b, ..., 100k are enabled into an initial state when the memory system 10 is powered on (S100). For example, enabling the ODT circuits into an initial state may be performed by applying power to the ODT circuits and setting a resistance of each of the ODT circuits to a default resistance value.

A resistance value of the ODT circuit of at least one write non-target memory unit among the plurality of memory units 100a, 100b, ..., 100k is set to a first resistance value during a write operation on a write target memory unit among the plurality of memory units 100a, 100b, ..., 100k (S200). For example, a write non-target memory unit is a memory unit that is not a target of the write operation.

A resistance value of the ODT circuit of at least one read non-target memory unit among the plurality of memory units 100a, 100b, ..., 100k is set to a second resistance value during a read operation on a read target memory unit among the plurality of memory units 100a, 100b, ..., 100k (S300). For example, a read non-target memory unit is a memory unit that is not a target of the read operation.

While operation S300 is illustrated as occurring after operation S200, operation S300 may occurred before operation S200. Further, operation S200 could be repeated on another group of memory units before executing operation S300, or operation S300 could be repeated on another group of memory units before executing operation S200.

A memory access operation may include a write operation and a read operation and the memory access operation may be differentiated from other operations such as a mode register write operation, a mode register read operation, a refresh operation, etc.

In case of the write operation, the plurality of memory units 100a, 100b, ..., 100k may be divided into a write target memory unit that is an object (or target) of the write operation and non-target memory units that exclude the write target memory unit. In case of the read operation, the plurality of memory units 100a, 100b, ..., 100k may be divided into a read target memory unit that is an object (or target) of the read operation and non-target memory units that exclude the read target memory unit. The write target memory unit or the read target memory unit may be simply referred to as a target memory unit or a target memory rank.

Referring to FIG. 6, at time point T1 when the memory system 10 is powered on, the ODT circuits of the plurality of memory units 100a, 100b, ..., 100k are set to the initial state. In some embodiments, each of the ODT circuits of the plurality of memory units 100a, 100b, ..., 100k is set to have a default resistance value in the initial state.

Even though FIG. 6 illustrates that an enabling time point of the ODT circuits coincides with power-on timing, the power-on sequence may be completed first and then after a certain time interval elapses, the ODT circuits may be set to the initial state.

During time intervals T2-T3 and T4-T5 while the write operation is performed, all the ODT circuits of the memory units 100a, 100b, ..., 100k including the write target memory unit and the non-target memory units maintain an enabled state. In some embodiments, a resistance value of the ODT circuit of the write target memory unit is set to have a first resistance value during the write operation. In an exemplary embodiment, the ODT circuit of the write target memory is set to have the first resistance value during time intervals T2-T3 and T4-T5.

In some embodiments, all the ODT circuits of the memory units 100a, 100b, ..., 100k including the write target memory unit and the non-target memory units maintain the initial state to have the default resistance value.

During a time interval T6-T7 while the read operation is performed, the ODT circuit of the read target memory unit is disabled and the ODT circuits of the non-target memory units are enabled. In some embodiments, the ODT circuits of the non-target memory units are set to have a second resistance value different from the first resistance value. In an exemplary embodiment, the ODT circuits of the non-target memory units are set to have a second resistance value different from the first resistance value during time interval T6-T7.

In some embodiments, the first resistance value and the second resistance value may have a ratio of a:b and each of a and b is a natural number smaller than nine. In an exemplary embodiment, the first resistance value is 120 ohms and the second resistance value is 90 ohms. In an exemplary embodiment, the first resistance value is larger than the second resistance value.

In some embodiments, all the ODT circuits of the memory units 100a, 100b, ..., 100k including the write target memory unit and the non-target memory units maintain the initial state to have the default resistance value.

In some embodiments, the ODT circuit of the at least one non-target memory unit is set to be disabled to have a high impedance during one of the write operation and the read operation.

At time point T8 when the memory system 10 is powered off, a power supply is blocked and the ODT circuits of all the memory units 100a, 100b, ..., 100k are disabled.

As such, the method of controlling ODT and the memory system performing the method according to at least one exemplary embodiment of the inventive concept may increase signal integrity to enhance performance by setting the resistance values of the ODT circuits of the non-target memory rank differently in the write operation and the read operation.

Figure 7A:
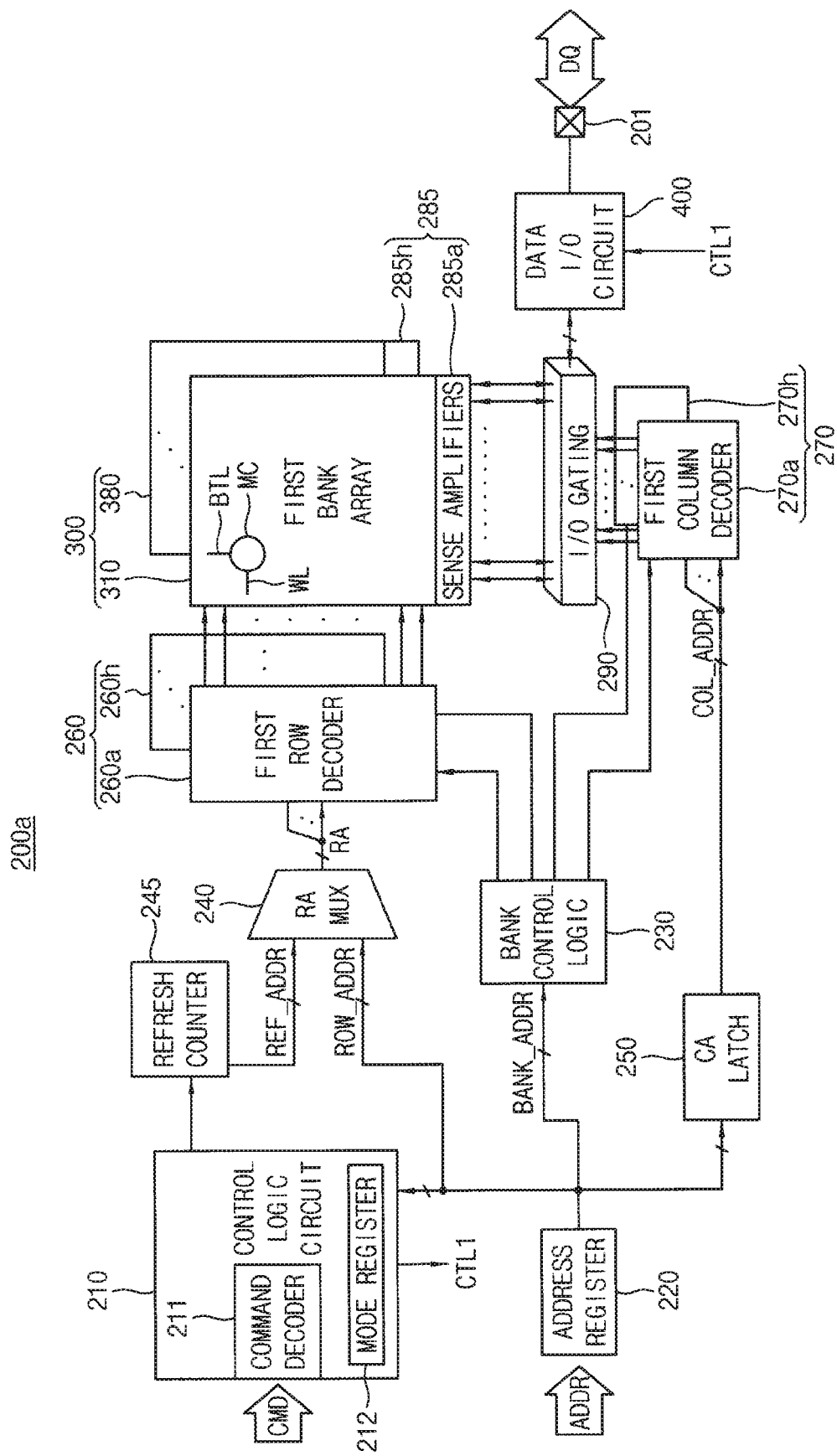
FIG. 7A is a block diagram illustrating an example of a memory chip included in a memory unit in the memory system of FIG. 1 according to an exemplary embodiment of the inventive concept.

FIG. 7A is a block diagram illustrating an example of a memory chip included in a memory unit in the memory system of FIG. 1 according to an exemplary embodiment of the inventive concept.

Referring to FIG. 7A, a memory chip 200a includes a control logic circuit 210, an address register 220, a bank control logic 230 (e.g., a logic circuit), a refresh counter 245 (e.g., a counting circuit), a row address multiplexer 240, a column address latch 250, a row decoder 260 (e.g., a decoder circuit), a column decoder 270 (e.g., a decoder circuit), a memory cell array 300, a sense amplifier unit 285, an input/output (I/O) gating circuit 290 and a data I/O circuit 400.

The data I/O circuit 400 may receive or transmit data DQ through a data I/O pin (or, pad) 201.

The memory cell array 300 includes first through eighth bank arrays 310~380. The row decoder 260 includes first through eighth row decoders 260a~260h respectively coupled to the first through eighth bank arrays 310~380, the column decoder 270 includes first through eighth column decoders 270a~270h respectively coupled to the first through eighth bank arrays 310~380, and the sense amplifier unit 285 includes first through eighth sense amplifiers 285a~285h respectively coupled to the first through eighth bank arrays 310~380.

Each of the first through eighth bank arrays 310~380 includes a plurality of volatile memory cells MC formed at intersections of a plurality of word-lines WL and a plurality of bit-line BTL.

The address register 220 receives an address ADDR including a bank address BANK_ADDR, a row address ROW_ADDR and a column address COL_ADDR from the memory controller 20. The address register 220 provides the received bank address BANK_ADDR to the bank control logic 230, provides the received row address ROW_ADDR to the row address multiplexer 240, and provides the received column address COL_ADDR to the column address latch 250.

The bank control logic 230 generates bank control signals in response to the bank address BANK_ADDR. One of the first through eighth row decoders 260a~260h corresponding to the bank address BANK_ADDR is activated in response to the bank control signals, and one of the first through eighth column decoders 270a~270h corresponding to the bank address BANK_ADDR is activated in response to the bank control signals.

The row address multiplexer 240 receives the row address ROW_ADDR from the address register 220, and receives a refresh row address REF_ADDR from the refresh counter 245. The row address multiplexer 240 selectively outputs the row address ROW_ADDR or the refresh row address REF_ADDR as a row address RA. The row address RA that is output from the row address multiplexer 240 is applied to the first through eighth row decoders 260a~260h.

The refresh counter 245 outputs the refresh row address REF_ADDR that may sequentially change under control of the control logic circuit 210.

The activated one of the first through eighth row decoders 260a~260h, by the bank control logic 230, decodes the row address RA that is output from the row address multiplexer 240, and activates a word-line corresponding to the row address RA. For example, the activated bank row decoder applies a word-line driving voltage to the word-line corresponding to the row address RA.

The column address latch 250 receives the column address COL_ADDR from the address register 220, and temporarily stores the received column address COL_ADDR. In some embodiments, in a burst mode, the column address latch 250 generates column addresses COL_ADDR that increment from the received column address COL_ADDR. The column address latch 250 applies the temporarily stored or generated column address COL_ADDR to the first through eighth column decoders 270a~270h.

The activated one of the first through eighth column decoders 270a~270h activates a sense amplifier corresponding to the bank address BANK_ADDR and the column address COL_ADDR through the I/O gating circuit 290.

In an exemplary embodiment, the I/O gating circuit 290 includes a circuitry for gating input/output data, and further includes input data mask logic, read data latches for storing data that is output from the first through eighth bank arrays 310~380, and write drivers for writing data to the first through eighth bank arrays 310~380.

Date read from one bank array of the first through eighth bank arrays 310~380 is sensed by a sense amplifier coupled to the one bank array from which the data is to be read, and is stored in the read data latches. The data stored in the read data latches may be provided to the memory controller 20 via the data I/O circuit 400.

The data DQ to be written in one bank array of the first through eighth bank arrays 310~380 may be provided to the data I/O circuit 400 from the memory controller 20, and the I/O gating circuit 290 may write the data in a sub-page of a target page in one bank array through the write drivers.

The control logic circuit 210 may control operations of the memory chip 200a. For example, the control logic circuit 210 may generate control signals for the memory chip 200a used for performing a write operation or a read operation. The control logic circuit 210 includes a command decoder 211 that decodes the command CMD received from the memory controller 20 and a mode register 212 that sets an operation mode of the memory chip 200a.

The mode register 212 may be used to set a resistance value of an ODT circuit in the data I/O circuit 400. The control logic circuit 210 may generate a first control signal CTL1 based on values set in the mode register 212 and may provide the first control signal CTL1 to the data I/O circuit 400 to set the resistance value of the ODT circuit in the data I/O circuit 400.

In an exemplary embodiment, the mode register 212 is used to set a resistance value of an ODT circuit in the data I/O circuit 400 in a non-target memory rank to a first resistance value during a write operation and to set a resistance value of an ODT circuit in the data I/O circuit 400 in a non-target memory rank to a second resistance value during a read operation. In an exemplary embodiment of the inventive concept, the mode register 212 sets the second resistance value to be the same as the first resistance value in a first mode of a plurality of modes. In an exemplary embodiment, the mode register 212 is used to set the second resistance value to be different from the first resistance value in a second mode of a plurality of modes. In an exemplary embodiment, the mode register 212 is used to disable the ODT circuit in the data I/O circuit 400 in a non-target memory rank such that the ODT circuit has a high impedance during one of the write operation and the read operation.

The memory chip 200a may include a DRAM chip.

Figure 7B:
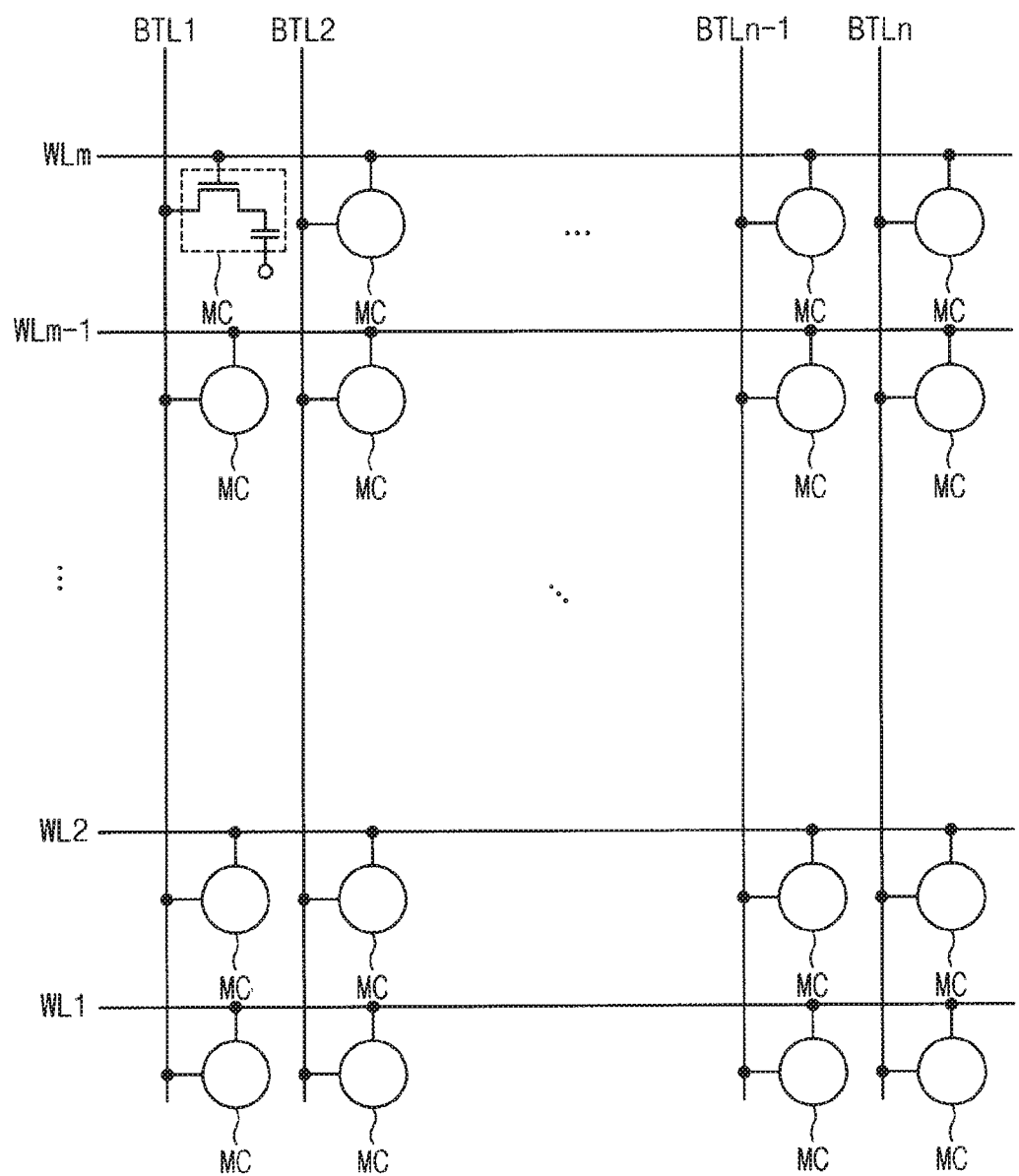
FIG. 7B illustrates an example of the first bank array in the memory chip of FIG. 7A according to an exemplary embodiment of the inventive concept.

FIG. 7B illustrates an example of the first bank array in the memory chip of FIG. 7A according to an exemplary embodiment of the inventive concept.

Referring to FIG. 7B, the first bank array 310 includes a plurality of word-lines WL1~WLm (m is a natural number equal to or greater than two), a plurality of bit-lines BTL1~BTLn (n is a natural number equal to or greater than two), and a plurality of memory cells MCs disposed at intersections between the word-lines WL1~WLm and the bit-lines BTL1~BTLn. Each of the memory cells MCs includes a cell transistor coupled to each of the word-lines WL1~WLm and each of the bit-lines BTL1~BTLn and a cell capacitor coupled to the cell transistor.

Figure 8:
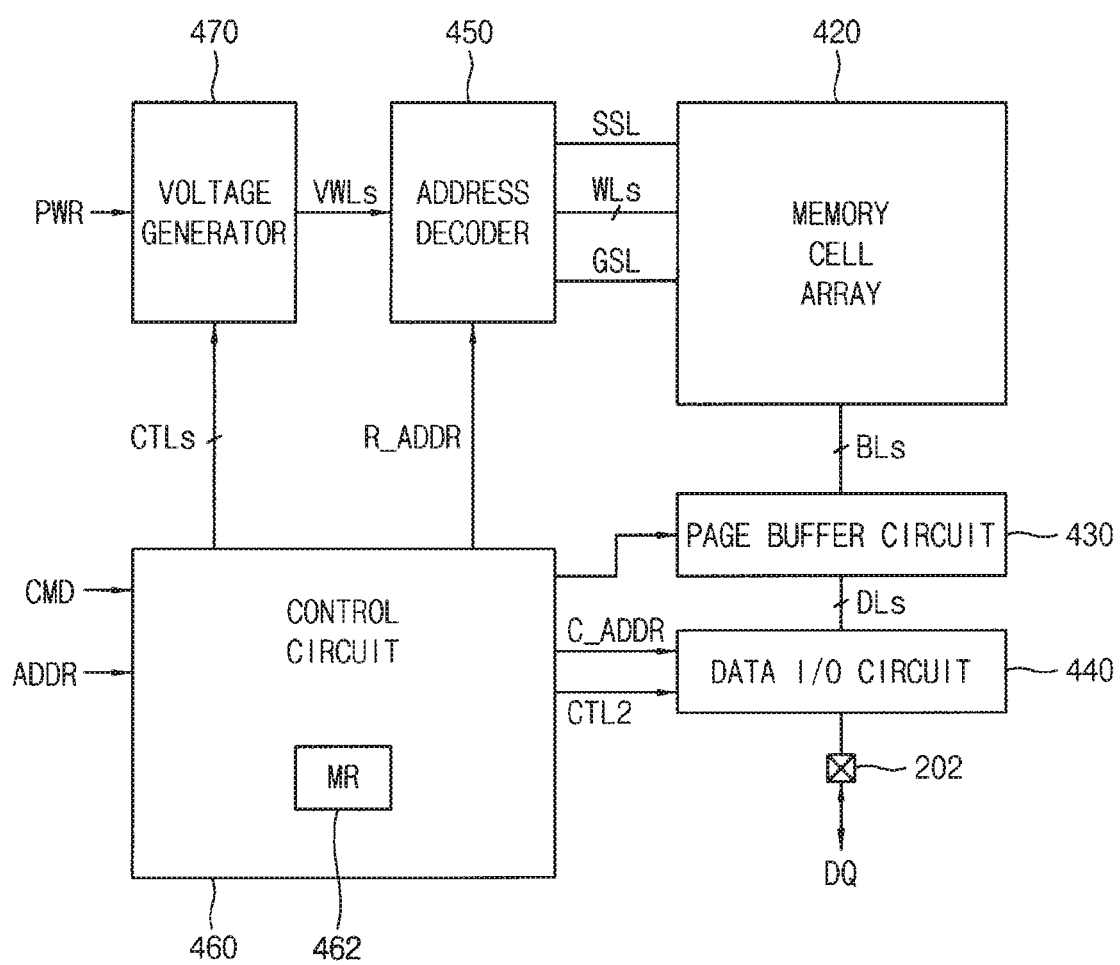
FIG. 8 is a block diagram illustrating an example of a memory chip included in a memory unit in the memory system of FIG. 1 according to an exemplary embodiment of the inventive concept.

FIG. 8 is a block diagram illustrating an example of a memory chip included in a memory unit in the memory system of FIG. 1 according to an exemplary embodiment of the inventive concept.

FIG. 8 illustrates a case when the memory chip includes a flash memory chip.

Referring to FIG. 8, a memory chip 200a includes a memory cell array 420, an address decoder 450, a page buffer circuit 430, a data I/O circuit 440, a control circuit 460 and a voltage generator 470.

The memory cell array 420 is coupled to the address decoder 450 through one or more string selection lines SSL, a plurality of word-lines WLs, and one or more ground selection lines GSL. In addition, the memory cell array 420 is coupled to the page buffer circuit 430 through a plurality of bit-lines BLs. The memory cell array 420 may include a plurality of memory cells coupled to the plurality of word-lines WLs and the plurality of bit-lines BLs.

In some example embodiments, the memory cell array 420 may be a three-dimensional memory cell array, which is formed on a substrate in a three-dimensional structure (or a vertical structure). In this case, the memory cell array 420 may include vertical cell strings that are vertically oriented such that at least one memory cell is located over another memory cell. For example, the memory cells may be stacked on top of one another.

In other example embodiments, the memory cell array 420 may be a two-dimensional memory cell array, which is formed on a substrate in a two-dimensional structure (or a horizontal structure).

The control circuit 460 may receive a command (signal) CMD and an address (signal) ADDR, and control an operation of the memory chip 200b based on the command signal CMD and the address signal ADDR.

For example, the control circuit 460 may generate control signals CTLs, which are used for controlling the voltage generator 470 and a control signal for controlling the page buffer circuit 430, based on the command signal CMD, and may generate a row address R_ADDR and a column address C_ADDR based on the address signal ADDR. The control circuit 460 may provide the row address R_ADDR to the address decoder 450 and provide the column address C_ADDR to the data input/output circuit 430. In addition, the control circuit 460 may include a mode register 462, generate a control signal CTL2 for controlling an ODT circuit in the data I/O circuit 440 and provide the control signal CTL2 to the data I/O circuit 440.

The address decoder 450 is coupled to the memory cell array 420 through the one or more string selection lines SSL, the plurality of word-lines WLs, and the one or more ground selection lines GSL. During the program operation (e.g., a write operation) or the read operation, the address decoder 450 may determine one of the plurality of word-lines WLs as a selected word-line, and determine the rest of the plurality of word-lines WLs except for the selected word-line as unselected word-lines based on the row address R_ADDR.

The voltage generator 470 may generate word-line voltages VWLs, which are required for the operation of the memory chip 200b, based on the control signals CTLs from the control circuit 460. The voltage generator 470 may receive power PWR from the memory controller 20. The word-line voltages VWLs may be applied to the plurality of word-lines WLs through the address decoder 450.

The page buffer circuit 430 is coupled to the memory cell array 420 through the plurality of bit-lines BLs. The page buffer circuit 430 may include a plurality of page buffers. In some example embodiments, one page buffer may be connected to one bit-line. In other example embodiments, one page buffer may be connected to two or more bit-lines.

The page buffer circuit 430 may temporarily store data to be programmed in a selected page, or data read out from the selected page.

The data I/O circuit 440 is coupled to the page buffer circuit 430 through data lines DLs. During the program operation, the data I/O circuit 440 may receive program data DQ from the memory controller 20 and provide the program data DQ to the page buffer circuit 430 based on the column address C_ADDR received from the control circuit 460. During the read operation, the data I/O circuit 440 may provide read data DQ, which are stored in the page buffer circuit 430, to the memory controller 20 based on the column address C_ADDR received from the control circuit 460.

Figure 9:
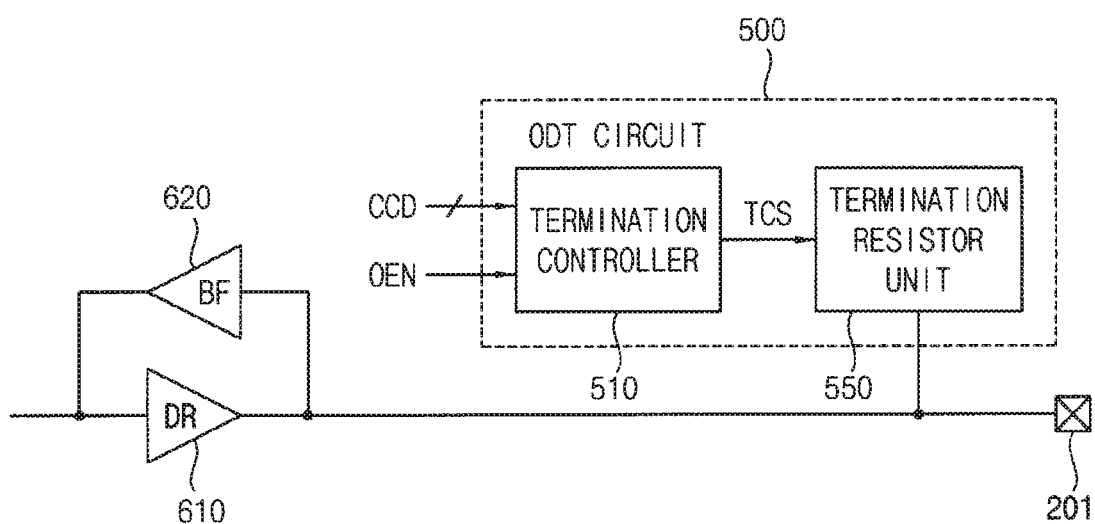
FIG. 9 is a block diagram illustrating an example of a data input/output (I/O) circuit included in the memory chip of FIG. 7A according to an exemplary embodiment of the inventive concept.

FIG. 9 is a block diagram illustrating an example of the data I/O circuit included in the memory chip of FIG. 7A according to an exemplary embodiment of the inventive concept.

Referring to FIG. 9, the data I/O circuit 400 includes an ODT circuit 500, a data I/O pin 201, a transmission driver DR 610 and a reception buffer BF 620. The transmission driver 610 drives the data I/O pin 201 based on read data and the reception buffer 620 receives write data provided through the data I/O pin 201.

The ODT circuit 500 includes a termination controller 510 (e.g., a control circuit) and a termination resistor unit 550 (e.g., a circuit including one or more resistors).

The termination resistor unit 550 is coupled to the data I/O pin 201 and provides termination impedance to a transmission line coupled to the data I/O pin 201.

A method of controlling ODT according to an exemplary embodiment of the inventive concept may be applied to control terminations of I/O pins for bidirectional communication between the memory controller 20 and the memory chip. Thus, the method according to example embodiments may be applied to a data strobe pin, a data mask pin, or a termination data strobe pin in addition to the data I/O pin 201. The term "pin" broadly refers to an electrical interconnection for an integrated circuit, e.g., a pad or other electrical contact on the integrated circuit.

In an exemplary embodiment, the termination resistor unit 550 performs a pull-up termination operation to provide termination resistance between a power supply voltage node and the data I/O pin 201 and/or a pull-down termination operation to provide termination resistance between a ground node and the data I/O pin 201.

Even though FIG. 9 illustrates an example embodiment where a distinct termination resistor unit 550 is included, a signal driver (not shown) in the transmission driver 610 may instead function as termination resistors. For example, in the write operation, the transmission driver 610 does not transmit read data and the transmission driver 610 functions as the termination resistor unit 550 while the reception buffer 620 is enabled to receive write data.

When the termination resistor unit 550 performs the pull-up termination operation, a voltage of the transmission line connected to the data I/O pin 201 may be maintained substantially at a level of the power supply voltage. As a result, a current flows through the termination resistor unit 550 and the transmission line only when data of a logic low level are transferred. In contrast, when the termination resistor unit 550 performs the pull-down termination operation, the voltage of the transmission line connected to the data I/O pin 201 may be maintained substantially at the ground voltage. As a result, a current flows through the termination resistor unit 550 and the transmission line only when data of a logic high level is transferred.

The termination controller 510 receives a control code CCD and an output enable signal OEN. The termination controller 510 generates a termination control signal TCS for controlling the termination resistor unit 550 to adjust the termination impedance based on the control code CCD and the output enable signal OEN.

In some embodiments, the control code CCD is a plurality of bits associated with a data rate. As will be described below with reference to FIGS. 19A and 19B, the control code CCD of multiple bits may be provided based on the values stored in the mode register 212 in FIG. 7A.

In some embodiments, the output enable signal OEN is activated during a read operation. For example, the output enable signal OEN could have a high state when activated and a low state when deactivated. While the output enable signal OEN is activated, the termination controller 510 provides a termination control signal TCS at a predetermined logic level to control the termination resistor unit 550 not to provide the termination impedance. In that case, the termination resistor unit 550 may be electrically decoupled from the data I/O pin 201 in response to the termination control signal TCS having the predetermined logic level. When the termination resistor unit 550 is electrically decoupled from the data I/O pin 201, the ODT circuit 500 or the termination resistor unit 550 may be referred to as "being disabled".

While the output enable signal OEN is deactivated during a write operation, the termination controller 510 generates the termination control signal TCS to control the termination resistor unit 550 to provide the termination impedance. The termination controller 510 may change a logic level of the termination control signal TCS in response to the control code CCD to vary the termination impedance. For example, a value of the control code CCD may indicate a particular termination impedance or resistance. If the termination resistor unit 550 was previously electrically decoupled from the data I/O pin 201, the termination resistor unit 550 is re-coupled to the data I/O pin 201 in response to application of the termination control signal TCS. For example, the termination resistor unit 550 may include a plurality of resistors where zero or more of the resistors are prevented from contributing their resistance according to the control code CCD to set the particular termination impedance or resistance.

Figure 10A:
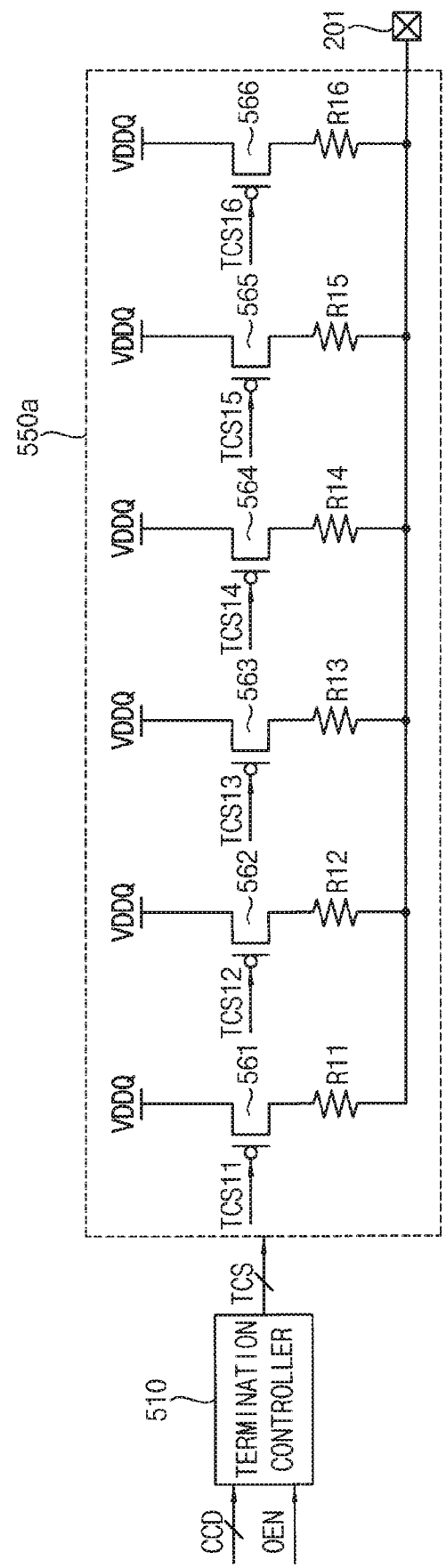
FIG. 10A is a circuit diagram illustrating an example of an ODT circuit included in the data I/O circuit of FIG. 9 according to an exemplary embodiment of the inventive concept.

FIG. 10A is a circuit diagram illustrating an example of an ODT circuit included in the data I/O circuit of FIG. 9 according to an exemplary embodiment of the inventive concept.

Referring to FIG. 10A, an ODT circuit 500a includes a termination controller 510 and a termination resistor unit 550a.

The termination resistor unit 550a includes first through sixth p-channel metal-oxide semiconductor (PMOS) transistors 561~566 and first through sixth resistors R11~R16. Each of the first through sixth PMOS transistors 561~566 is connected to respective one of the first through sixth resistors R11~R16 in series between a power supply voltage VDDQ and the data I/O pin 201.

The termination controller 510 receives the control code CCD and the output enable signal OEN, and generates a termination control signal TCS1 for controlling the termination resistor unit 550a. The termination controller 510 applies each of bits TCS11~TCS16 in the termination control signal TCS1 to a respective gate of the first through sixth PMOS transistors 561~566 to adjust the termination resistance of the termination resistor unit 550a. In some embodiments, each of the first through sixth resistors R11~R16 have a unique resistance or have the same resistance. For example, one or more of the resistors could have a resistance of 240 ohms or 300 ohms. For example, the resistors may have 1% margin of error.

Figure 10B:
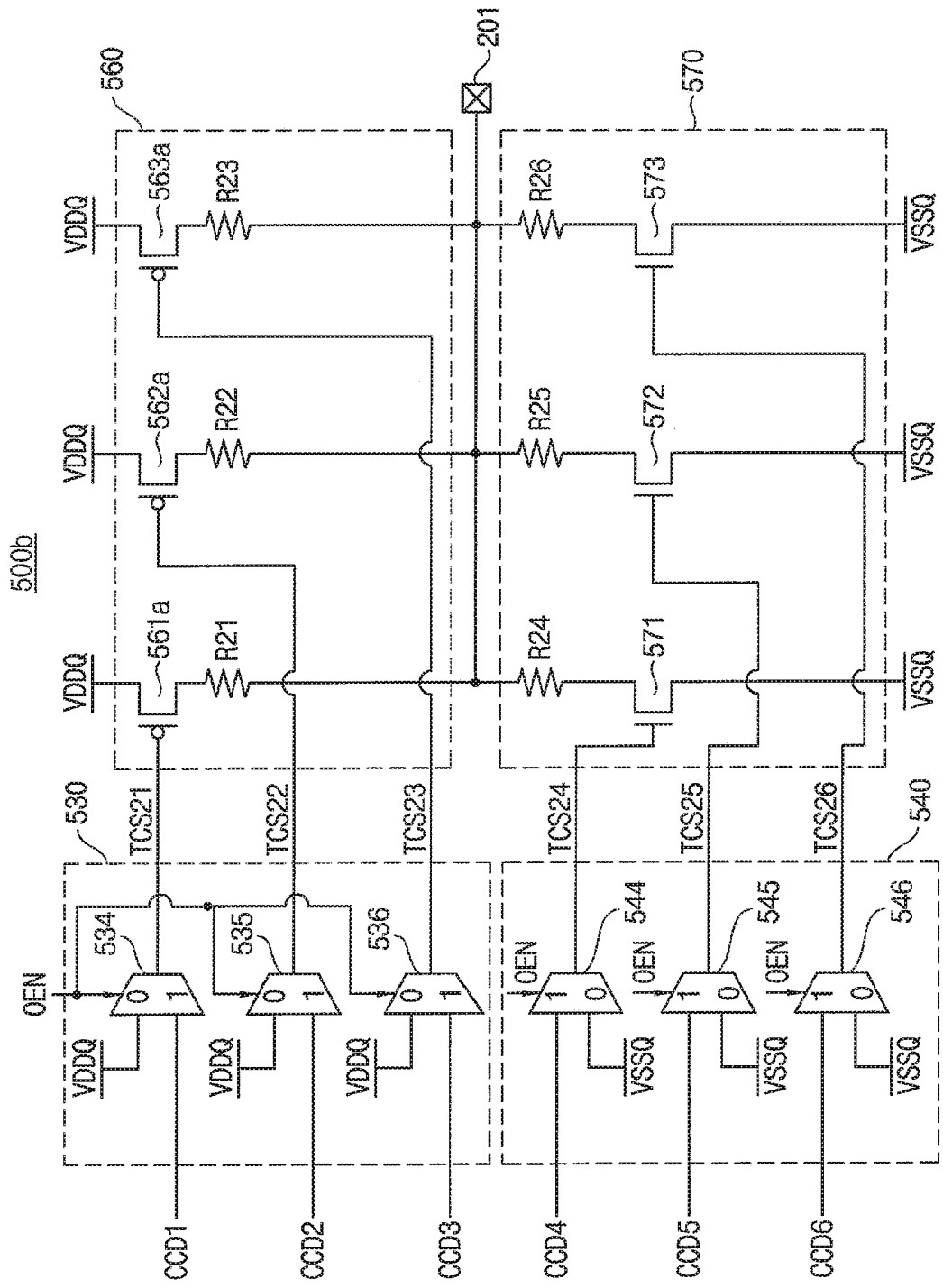
FIG. 10B is a circuit diagram illustrating an example an ODT circuit included in the data I/O circuit of FIG. 9 according to an exemplary embodiment of the inventive concept.

FIG. 10B is a circuit diagram illustrating an example an ODT circuit included in the data I/O circuit of FIG. 9 according to an exemplary embodiment of the inventive concept.

Referring to FIG. 10B, an ODT circuit 500b includes a pull-up termination control unit 530, a pull-down termination control unit 540, a pull-up driver 560 and a pull-down driver 570.

The pull-up termination control unit 530 includes first to third selectors 534~536 (e.g., multiplexers), and the pull-down termination control unit 540 includes fourth to sixth selectors 544~546 (e.g., multiplexers). The pull-up driver 560 includes first through third PMOS transistors 561a~563a and first through third resistors R21~R23. The first through third PMOS transistors 561a~563a are connected to a power supply voltage VDDQ, and each of the first through third resistors R21~R23 is connected between a respective one of the first through third PMOS transistors 561a~563a and the data I/O pin 201. The pull-down driver 570 includes first to third n-channel metal-oxide semiconductor (NMOS) transistors 571~573 and fourth to sixth resistors R24~R26. The first through third NMOS transistors 571~573 are connected to a ground voltage VSSQ, and each of the fourth through sixth resistors R24~R26 is connected between a respective one of the first through third NMOS transistors 571~573 and the data I/O pin 201.

Each of the first through third selectors 534~536 may receive the power supply voltage VDDQ as each of first inputs, the first through third control code bits CCD1, CCD2, and CCD3 as each of second inputs and the output enable signal OEN as each of control signals. Each of the fourth through sixth selectors 544~546 may receive the ground voltage VDDQ as each of first inputs, the fourth through sixth control code bits CCD4, CCD5, and CCD6 as each of second inputs and the output enable signal OEN as each of control signals. The control code CCD may include the control code bits CCD1-CCD6.

While the output enable signal OEN is activated at a logic high level during a read operation, the first through third selectors 534~536 outputs the first to third termination control signals TCS21, TCS22 and TCS23 of a logic high level and the fourth through sixth selectors 544~546 output the fourth to sixth termination control signals TCS4, TCS5 and TCS6 of a logic low level.

While the output enable signal OEN is deactivated at a logic low level during a write operation, first through third selectors 534~536 output the first through third control code bits CCD1, CCD2 and CCD3 as the first through third termination control signals TCS21, TCS22 and TCS23 and the fourth through sixth selectors 544~546 output the fourth to sixth control code bits CCD4, CCD5 and CCD6 as the fourth through sixth control signals CCS4, CCS5 and CCS6.

As described above, the control code CCD, that is, the control code bits CCD1~CCD6 may be associated with the data rate or the operating frequency. Accordingly, when the data rate is relatively high, channels are rapidly charged/discharged by decreasing the termination impedance. When the data rate is relatively low, current consumption may be reduced by increasing the termination impedance for decreasing DC currents flowing through the channels.

Although each of the first through sixth resistors R21~R26 is illustrated in FIG. 10B as a single resistor, in an exemplary embodiments, each of the first through sixth resistors R21~R26 may be implemented with a plurality of resistors that are connected in parallel and/or in series and a plurality of transistors for controlling connections of the plurality of resistors.

Figure 16A:
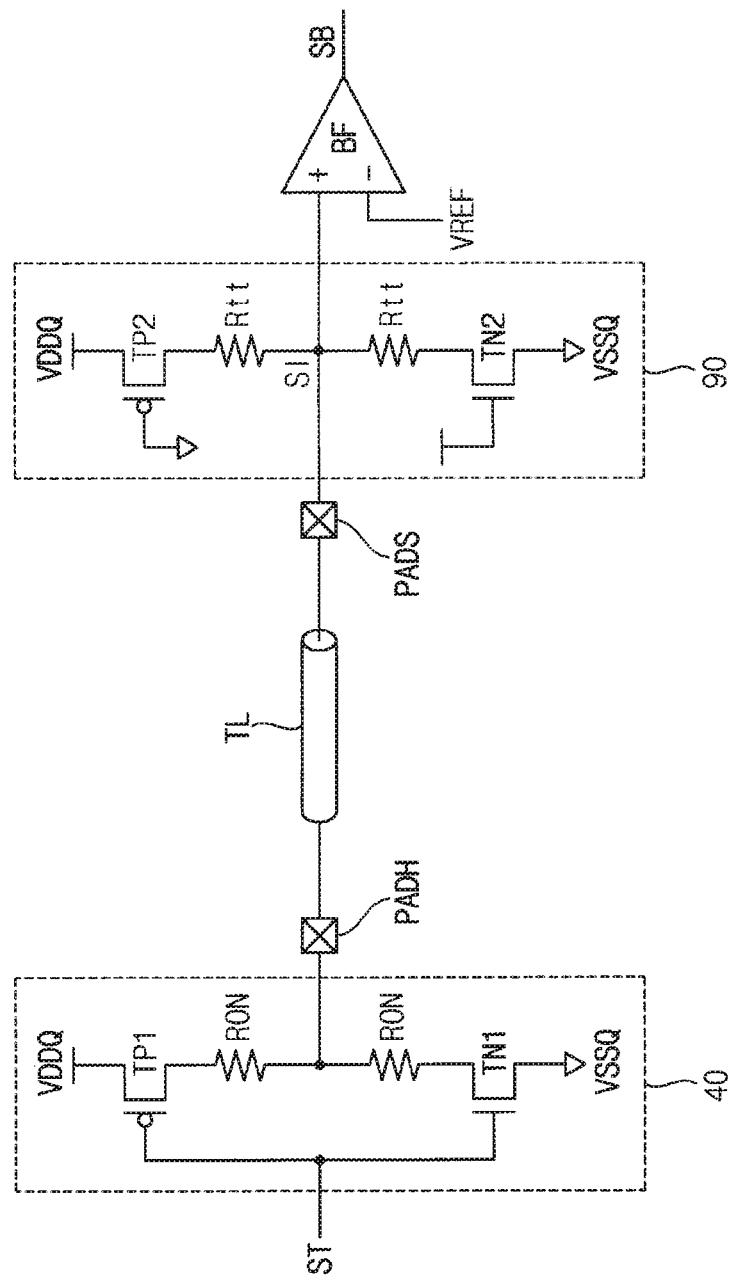
FIGS. 16A and 16B are diagrams for describing a center-tapped termination (CTT).
Figure 16B:
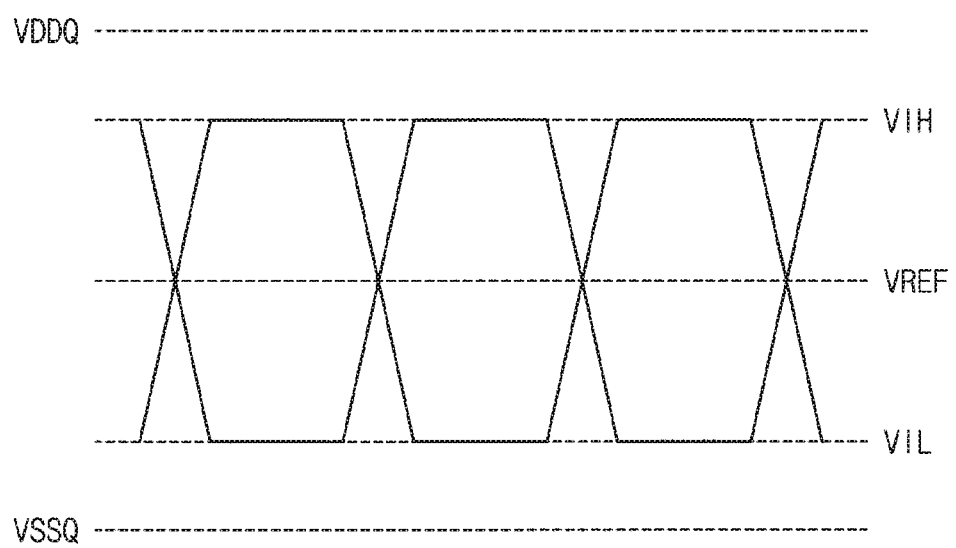

FIG. 10B illustrates an exemplary embodiment of the center-tap termination (CTT) scheme of FIGS. 16A and 16B, and a pseudo-open drain (POD) termination scheme may be understood therefrom.

Figure 11:
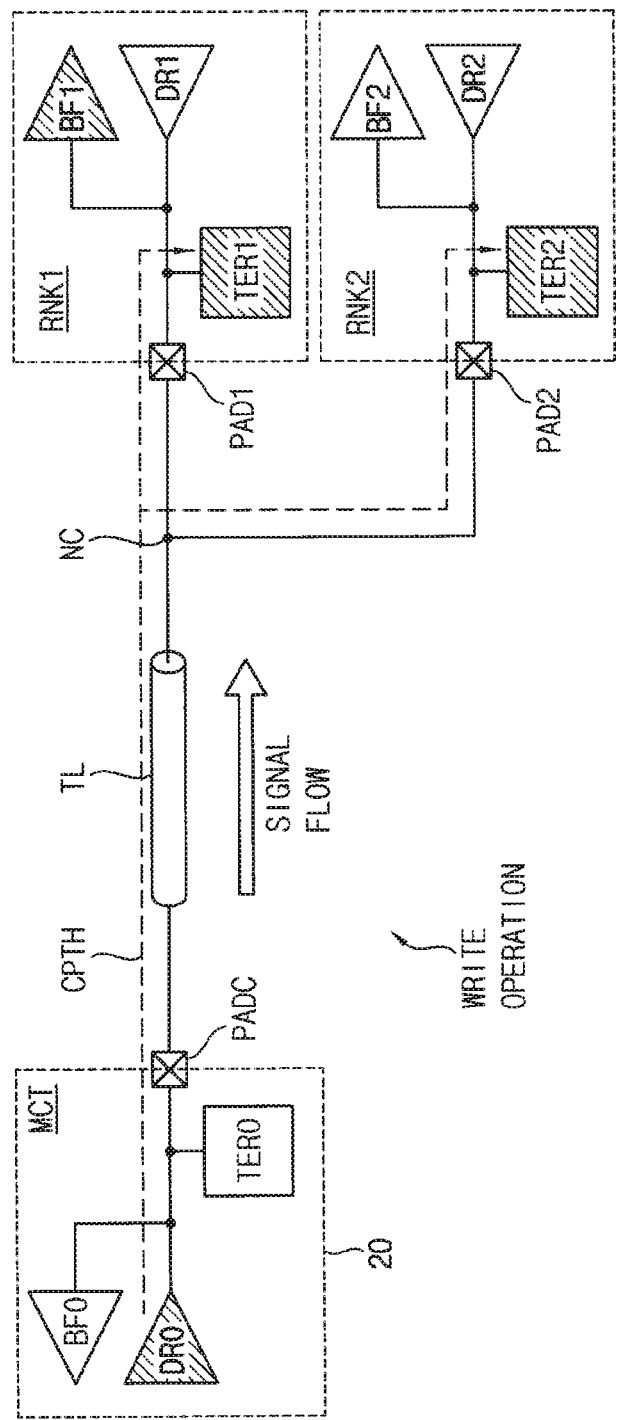
FIGS. 11, 12A and 12B are diagrams illustrating a method of controlling ODT in a write operation according to an exemplary embodiment of the inventive concept.
Figure 12A:
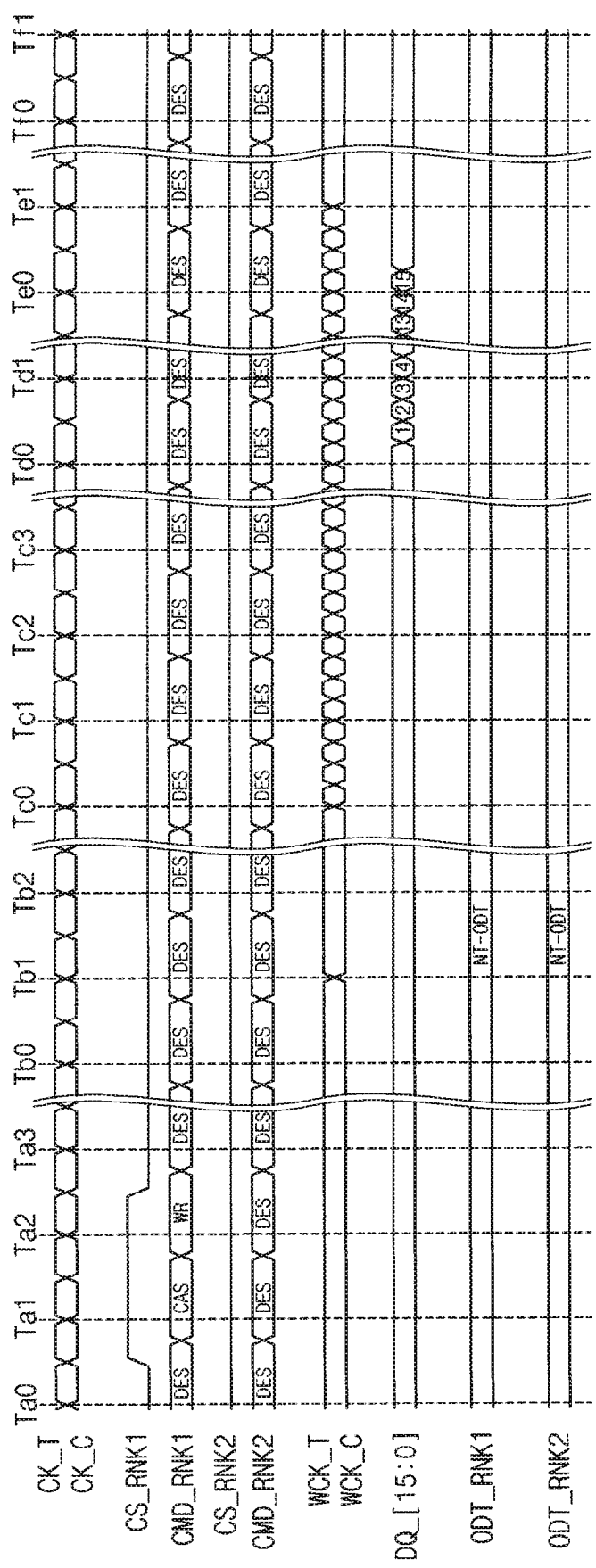
Figure 12B:
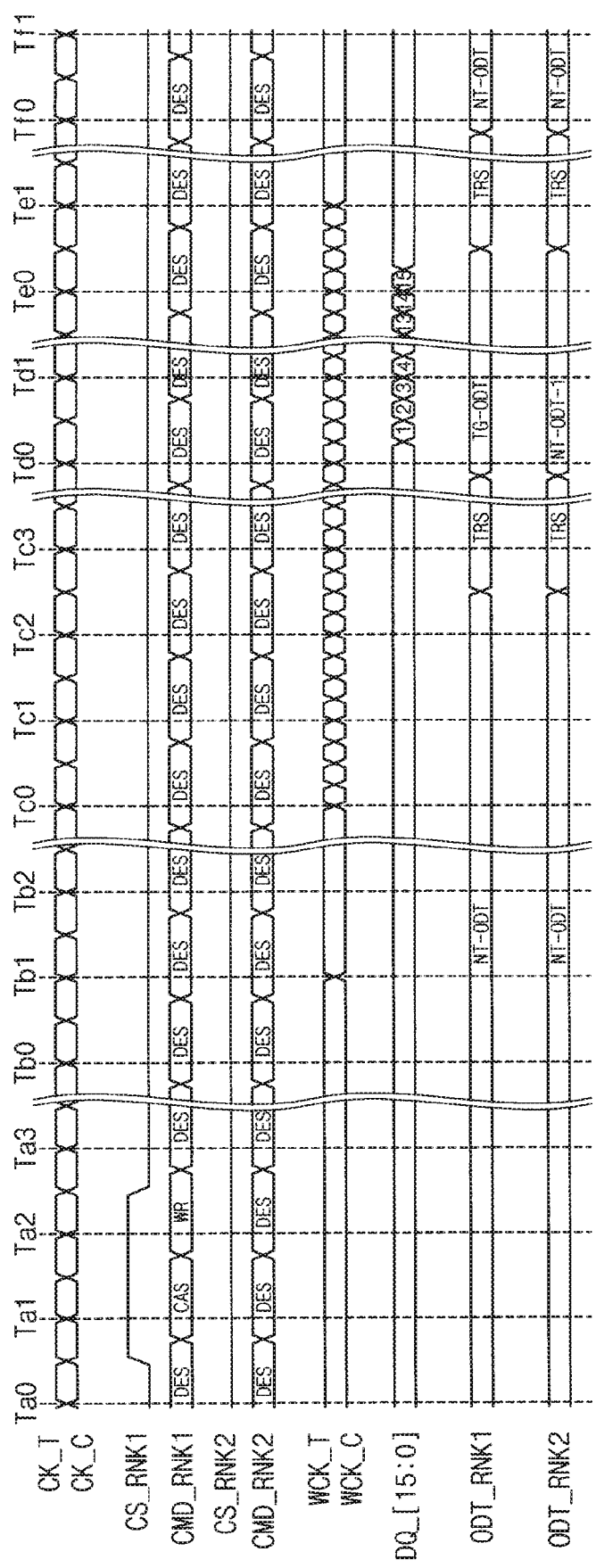

FIGS. 11, 12A and 12B are diagrams illustrating a method of controlling ODT in a write operation according to example embodiments.

In FIG. 11, it is assumed that the memory units 100a, 100b, . . . , 100k in FIG. 1 include a first memory rank RNK1 and a second memory rank RNK2 for convenience of explanation.

As illustrated in FIG. 11, the memory controller (MCT) 20 is connected in parallel to the plurality of memory ranks RNK1, RNK 2 through the data I/O pins PADC and PAD1, PAD2 and a transmission line TL. The transmission line TL is branched at a common node NC to the data I/O pins PAD1, PAD2 of the memory ranks RNK1 and RNK2. For example, the transmission line TL may include a main line connecting PADC to the common node NC, a first branch line connected to connecting the common node NC to PAD1, and a second branch line connecting the common node NC to PAD2.

FIG. 11 illustrates an example case where the first memory rank RNK1 corresponds to the write target memory rank and the second memory rank RNK2 corresponds to the non-target memory rank. In FIG. 11, the enabled elements are hatched.

In the write operation, the transmission driver DR0 is enabled and the reception buffer BF0 is disabled in the memory controller 20 corresponding to the data transmitter device. In addition, the reception buffer BF1 is enabled in the write target memory rank RNK1 corresponding to the data receiver device, whereas the transmission driver DR1 in the write target memory rank RNK1, the reception buffer BF2 and the transmission driver DR2 in the non-target memory rank RNK2 are disabled.

According to some embodiments, during the write operation, the ODT circuit TER1 in the write target memory rank RNK1 and the ODT circuit TER2 in the non-target memory rank RNK2 are all enabled. The ODT circuit TER0 in the memory controller 20 is disabled. A current path may be formed from the transmission driver DR0 in the memory controller 20 to all of the ODT circuits TER1 and TER2 in the memory ranks RNK1 and RNK2 and thus signal reflection may be reduced and signal integrity may be enhanced. In this case, a resistance value of the ODT circuit TER2 in the non-target memory rank RNK2 may be set to have a first resistance value.

In FIGS. 12A and 12B, time points Ta0-Tf1 correspond to edges of operation clock signal pair CK_T and CK_C. A first rank selection signal CS_RNK1 and a first command signal CMD_RNK1 are dedicated to a first memory rank RNK1 and a second rank selection signal CS_RNK2 and a second command signal CMD_RNK2 are dedicated to a second memory rank RNK2. A data strobe signal pair WCK_T and WCK_C and data signals DQ[15:0] are provided from the memory controller MC to the write target memory rank RNK1. ODT_RNK1 represents an ODT state of the first memory rank RNK1 and ODT_RNK2 represents an ODT state of the second memory rank RNK2. DES represents "deselect" and TRS represents transition intervals when the ODT state is changed.

FIGS. 12A and 12B show example cases of the write operation when the first memory rank RNK1 corresponds to the write target memory rank and the second memory rank RNK2 corresponds to the non-target memory rank. While the first rank selection signal CS_RNK1 is activated, the CAS command and the write command WR are transferred through the first command signal CMD_RNK1, and the second rank selection signal CS_RNK2 and the second command signal CMD_RNK2 maintain the deactivated states.

According to some embodiments, during the write operation, the ODT circuits in the write target memory rank RNK1 and the ODT circuit in the non-target memory rank RNK2 is enabled. In an exemplary embodiment, as illustrated in FIG. 12A, the ODT circuits in the write target memory rank RNK1 and the non-target memory rank RNK2 maintain the initial state NT-ODT while the data signals DQ[15:0] for the write operation are toggling (e.g., being applied). In some embodiments, the ODT circuit in the non-target memory rank RNK2 is changed to have a first resistance value NT-ODT-1 and the ODT circuits in the write target memory rank RNK1 is changed into a state TG-ODT having a resistance value different from that of the initial state NT-ODT while the data signals DQ[15:0] for the write operation are toggling (e.g., being applied).

Figure 14:
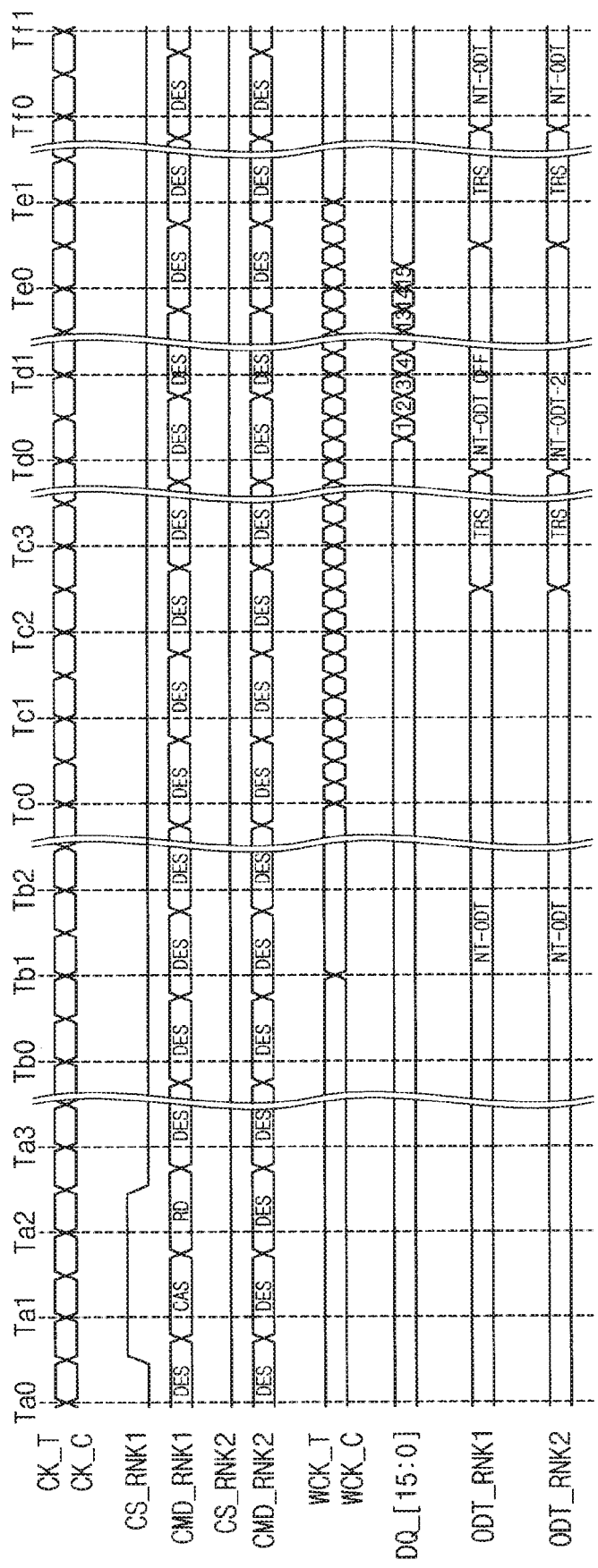

FIGS. 13 and 14 are diagrams illustrating a method of controlling ODT in a read operation according to an exemplary embodiment of the inventive concept.

As illustrated in FIG. 13, the memory controller 10 is connected in parallel to the plurality of memory ranks RNK1 and RNK2 through the data I/O pins PADC and PAD1 and PAD2 and the transmission line TL. The transmission line TL is branched at a common node NC to the data I/O pins PAD1 and PAD2 of the memory ranks RNK1 and RNK2.

FIG. 13 illustrates an example case where the first memory rank RNK1 corresponds to the read target memory rank and the second memory ranks RNK2 corresponds to the non-target memory ranks. In FIG. 13, the enabled elements are hatched.

In the read operation, the reception buffer BF0 is enabled and the transmission driver DR0 is disabled in the memory controller 20 corresponding to the data receiver device. In addition, the transmission driver DR1 is enabled in the read target memory rank RNK1 corresponding to the data transmitter device, whereas the reception buffer BF1 in the read target memory rank RNK1, the reception buffer BF2 and the transmission driver DR2 in the non-target memory rank RNK2 are disabled.

According to some example embodiments, during the read operation, the ODT circuit TER1 in the read target memory rank RNK1 is disabled and the ODT circuit TER2 in the non-target memory rank RNK2 is enabled. The ODT circuit TER0 in the memory controller 20 is enabled. A current path may be formed from the transmission driver DR1 in the read target memory rank RNK1 to the ODT circuit TER0 in the transmission driver DR0 and the ODT circuit TER2 in the non-target memory rank RNK2 and thus signal reflection may be reduced and signal integrity may be enhanced.

In FIG. 14, time points Ta0-Tf1 correspond to edges of an operation clock signal pair CK_T and CK_C. A first rank selection signal CS_RNK1 and a first command signal CMD_RNK1 are dedicated to a first memory rank RNK1 and a second rank selection signal CS_RNK2 and a second command signal CMD_RNK2 are dedicated to a second memory rank RNK2. A data strobe signal pair WCK_T and WCK_C and data signals DQ[15:0] are provided from the read target memory rank RNK1 to the memory controller MCT. While the data signals DQ are illustrated as being 16 bits, embodiments of the inventive concept are not limited thereto as the data signals DQ may have various sizes. ODT_RNK1 represents an ODT state of the first memory rank RNK1 and ODT_RNK2 represents an ODT state of the second memory rank RNK2. DES represents "deselect" and TRS represents transition intervals when the ODT state is changed.

FIG. 14 shows an example case of the read operation when the first memory rank RNK1 corresponds to the read target memory rank and the second memory rank RNK2 corresponds to the non-target memory rank. While the first rank selection signal CS_RNK1 is activated, the CAS command and the read command RD are transferred through the first command signal CMD_RNK1, and the second rank selection signal CS_RNK2 and the second command signal CMD_RNK2 maintain the deactivated states.

According to some example embodiments, during the read operation, the ODT circuit in the read target memory rank RNK1 is disabled and the ODT circuit in the non-target memory rank RNK2 is enabled. In some embodiments, as illustrated in FIG. 14, the ODT circuit in the non-target memory rank RNK2 is changed into a state to have a second resistance value NT-ODT-2 and the ODT circuit in the read target memory rank RNK1 is changed into the disabled state NT-ODT OFF while the data signals DQ[15:0] for the read operation are toggling (e.g. being applied).

FIG. 15 is a diagram illustrating an example of a resistance setting applied during a method of controlling ODT according to an exemplary embodiment of the inventive concept.

Referring to FIG. 15, during the write operation, the ODT circuit in the target memory rank RNK_TG has a default resistance value Rtt, the ODT circuit in the non-target memory rank RNK_NT has a first resistance value Rtt1 and the ODT circuit in the memory controller 20 is disabled. During the read operation, the ODT circuit in the target memory rank RNK_TG is disabled, the ODT circuit in the non-target memory rank RNK_NT has a second resistance value Rtt2 and the ODT circuit in the memory controller 20 has a default resistance value Rtt.

In some embodiments, the ODT circuits in the target memory rank RNK_TG and the non-target memory rank RNK_NT has the default resistance value Rtt in the write operation. The default resistance value Rtt may correspond to a resistance value in the initial state. Accordingly, as described with reference to FIG. 12A, the ODT circuits in the target memory rank RNK_TG and the non-target memory rank RNK_NT may maintain the initial state to have the default resistance value Rtt during the write operation.

FIGS. 16A and 16B are diagrams for describing a center-tapped termination (CTT).

Referring to FIG. 16A, a transmission driver 40 in a transmitter device drives an input-output pad PADH based on a transmission signal ST from an internal signal of the transmitter device. The input-output pad PADH of the transmitter device is connected to input-output pad PADS of a receiver device through a transmission line TL. A termination circuit 90 of the CTT scheme is connected to the input-output pad PADS of the receiver device for impedance matching. The reception buffer BF in the receiver device may compare the input signal SI through the input-output pad PADS with a reference voltage VREF to provide a buffer signal SB to an internal circuit of the receiver device. The reception buffer BF may be implemented by an operational amplifier.

The transmission driver 40 includes a pull-up unit connected between a first power supply voltage VDDQ and the input-output pad PADH and a pull-down unit connected between the input-output pad PADH and a second power supply voltage VSSQ lower than the first power supply voltage VDDQ. The pull-up unit may include a turn-on resistor RON (e.g., see upper RON in FIG. 16A) and a p-channel metal oxide semiconductor (PMOS) transistor TP1 that is switched in response to the transmission signal ST. The pull-down unit may include a turn-on resistor RON (e.g., see lower RON in FIG. 16A) and a n-channel metal oxide semiconductor (NMOS) transistor TN1 that is switched in response to the transmission signal ST. For example, the transmission signal ST may be applied to gates of the transistors TP1 and TN1. The turn-on resistors RON may be omitted and each turn-on resistor RON may represent a resistance between the voltage node and the input-output pad PADH when each of the transistors TP1 and TN1 is turned on.

The termination circuit 90 of the CTT scheme may include a first sub termination circuit connected between the first power supply voltage VDDQ and the input-output pad PADS and a second sub termination circuit connected between the input-output pad PADS and the second power supply voltage VSSQ. The first sub termination circuit may include a termination resistor Rtt (e.g., see upper Rtt in FIG. 16A) and a PMOS transistor TP2 that is turned on in response to a low voltage. The second sub termination circuit may include a termination resistor Rtt (e.g., see lower Rtt in FIG. 16A) and an NMOS transistor TN2 that is turned on in response to a high voltage. The termination resistors Rtt may be omitted and each termination resistor Rtt may represent a resistance between the voltage node and the input-output pad PADS when each of the transistors TP2 and TN2 is turned on.

In case of the termination circuit 90 of the CTT scheme in FIG. 16A, the high voltage level VIH and the low voltage level VIL of the input signal SI may be represented as FIG. 16B. The second power supply voltage VSSQ may be assumed to be a ground voltage (i.e., VSSQ=0) and the voltage drop along the transmission line TL may be neglected. Thus, the high voltage level VIH, the low voltage level VIL and an optimal reference voltage VREF may be calculated according to Expression1.

$$VIH = VDDQ*(RON+Rtt)/(2RON+Rtt),$$

$$VIL = VDDQ*RON/(2RON+Rtt),$$

$$VREF = (VIH+VIL)/2 = VDDQ/2 \qquad \text{Expression 1}$$

Figure 17A:
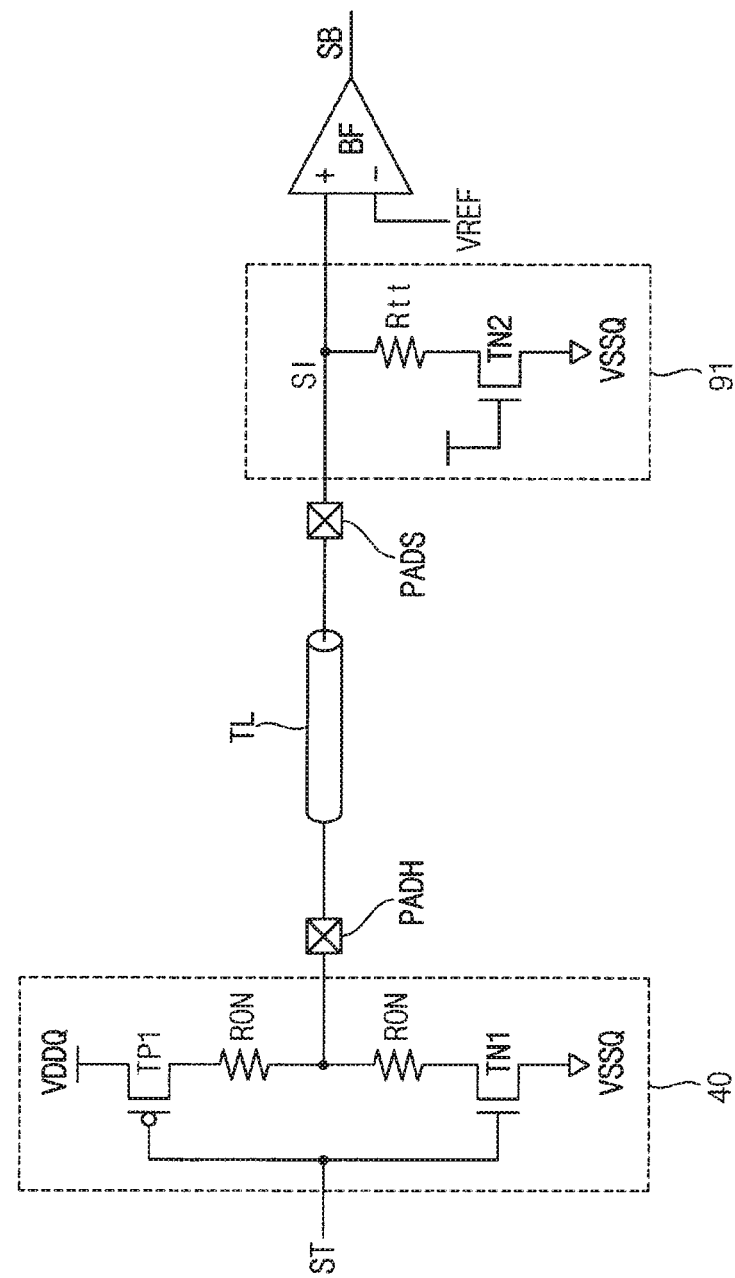
FIGS. 17A and 17B are diagrams for describing a first pseudo-open drain (POD) termination.
Figure 17B:
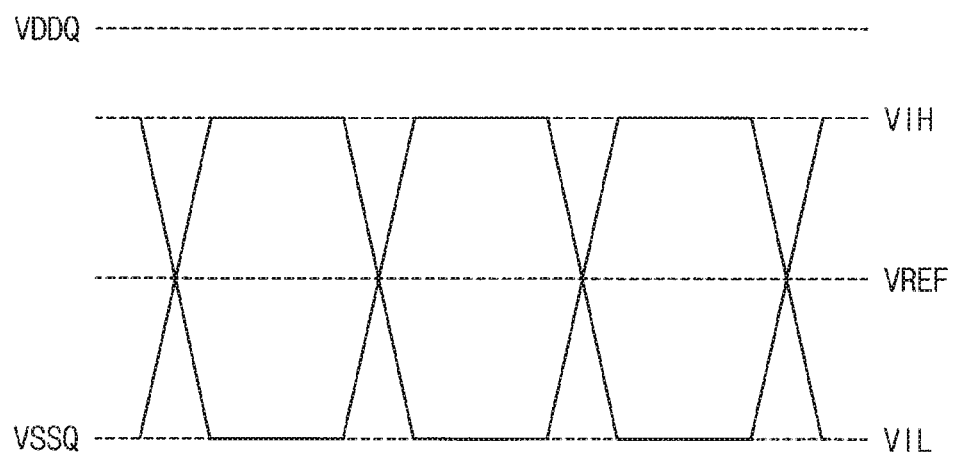

FIGS. 17A and 17B are diagrams for describing a first pseudo-open drain (POD) termination.

Referring to FIG. 17A, a transmission driver 40 in a transmitter device drives an input-output pad PADH based on a transmission signal ST from an internal signal of the transmitter device. The input-output pad PADH of the transmitter device is connected to input-output pad PADS of a receiver device through a transmission line TL. A termination circuit 91 of the first POD termination scheme may be connected to the input-output pad PADS of the receiver device for impedance matching. The reception buffer BF in the receiver device may compare the input signal SI through the input-output pad PADS with the reference voltage VREF to provide the buffer signal SB to an internal circuit of the receiver device.

The transmission driver 40 may include a pull-up unit connected between a first power supply voltage VDDQ and the input-output pad PADH and a pull-down unit connected between the input-output pad PADH and a second power supply voltage VSSQ lower than the first power supply voltage VDDQ. The pull-up unit may include a turn-on resistor RON (e.g., see upper RON in FIG. 17A) and a PMOS transistor TP1 that is switched in response to the transmission signal ST. The pull-down unit may include a turn-on resistor RON (e.g., see lower RON in FIG. 17A) and an NMOS transistor TN1 that is switched in response to the transmission signal ST. The turn-on resistors RON may be omitted and each turn-on resistor RON may represent a resistance between the voltage node and the input-output pad PADH when each of the transistors TP1 and TN1 is turned on.

The termination circuit 91 of the first POD termination scheme may include a termination resistor Rtt and an NMOS transistor TN2 that is turned on in response to a high voltage. The termination resistor Rtt may be omitted and the termination resistor Rtt may represent a resistance between the voltage node and the input-output pad PADS when the NMOS transistor TN2 is turned on.

In case of the termination circuit 91 of the first POD termination scheme in FIG. 17A, the high voltage level VIH and the low voltage level VIL of the input signal SI may be represented as FIG. 17B. The second power supply voltage VSSQ may be assumed to be a ground voltage (i.e., VSSQ=0) and the voltage drop along the transmission line TL may be neglected. Thus, the high voltage level VIH, the low voltage level VIL and the optimal reference voltage VREF may be calculated according to Expression2.

$$VIH = VDDQ*RTT/(RON+RTT),$$

$$VIL = VSSQ = 0,$$

$$VREF = (VIH+VIL)/2 = VDDQ*RTT/2(RON+RTT) \qquad \text{Expression 2}$$

Figure 18A:
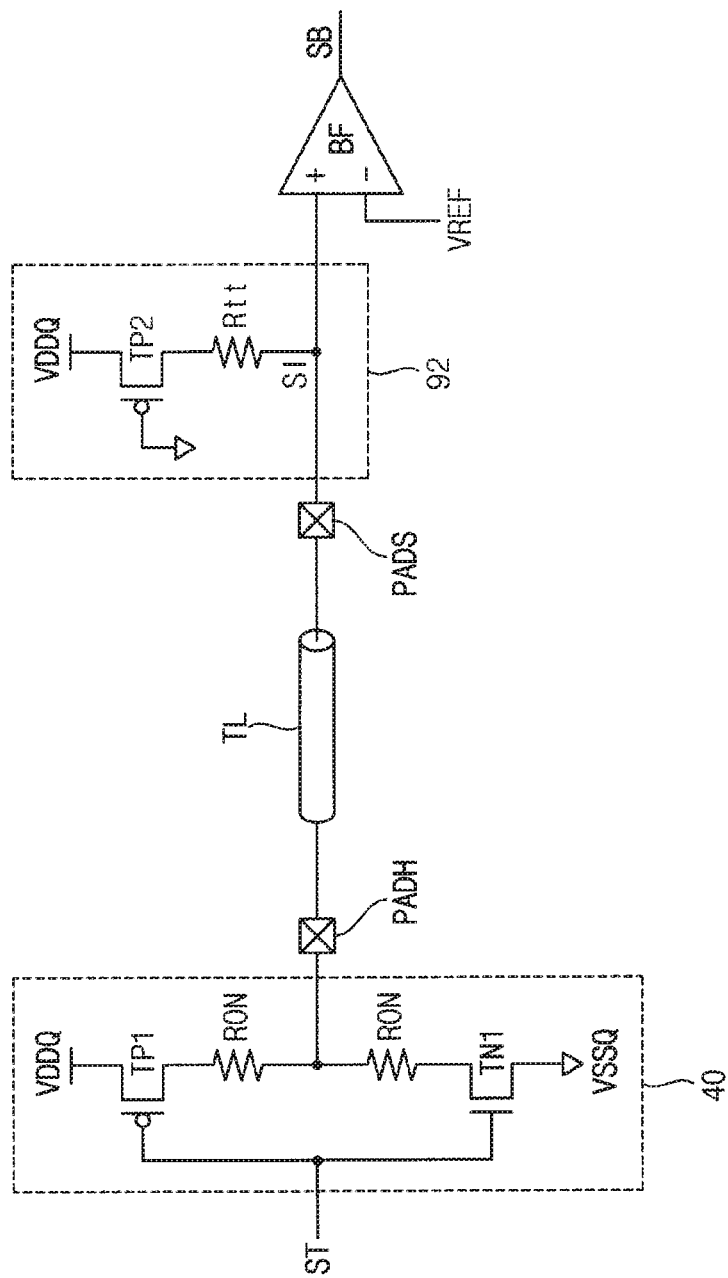
FIGS. 18A and 18B are diagrams for describing a second POD termination.
Figure 18B:
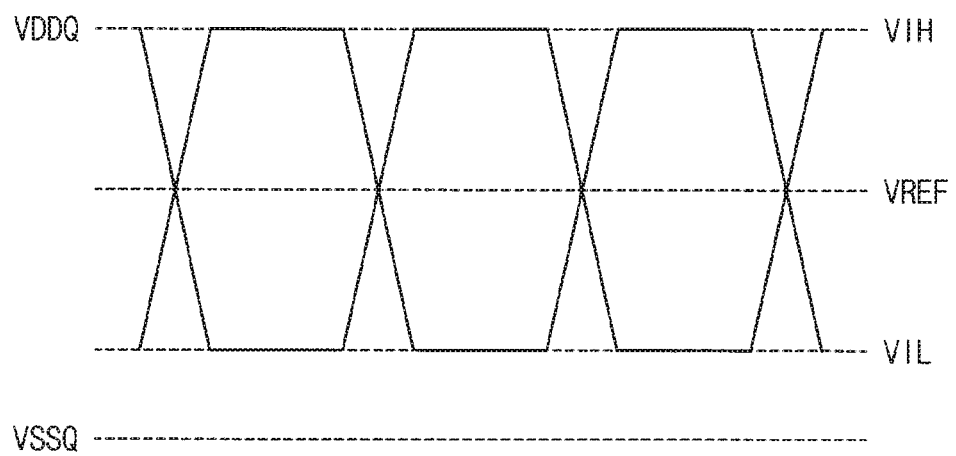

FIGS. 18A and 18B are diagrams for describing a second POD termination.

Referring to FIG. 18A, a transmission driver 40 in a transmitter device drives an input-output pad PADH based on a transmission signal ST from an internal signal of the transmitter device. The input-output pad PADH of the transmitter device is connected to input-output pad PADS of a receiver device through a transmission line TL. A termination circuit 92 of the second POD termination scheme is connected to the input-output pad PADS of the receiver device for impedance matching. The reception buffer BF in the receiver device may compare the input signal SI through the input-output pad PADS with the reference voltage VREF to provide the buffer signal SB to an internal circuit of the receiver device.

The transmission driver 40 may include a pull-up unit connected between a first power supply voltage VDDQ and the input-output pad PADH and a pull-down unit connected between the input-output pad PADH and a second power supply voltage VSSQ lower than the first power supply voltage VDDQ. The pull-up unit may include a turn-on resistor RON (e.g., see upper RON in FIG. 18A) and a PMOS transistor TP1 that is switched in response to the transmission signal ST. The pull-down unit may include a turn-on resistor RON (e.g., see lower RON in FIG. 18A) and an NMOS transistor TN1 that is switched in response to the transmission signal ST.

The turn-on resistors RON may be omitted and each turn-on resistor RON may represent a resistance between the voltage node and the input-output pad PADH when each of the transistors TP1 and TN1 is turned on.

The termination circuit 92 of the second POD termination scheme may include a termination resistor Rtt and a PMOS transistor TP2 that is turned on in response to a low voltage. The termination resistor Rtt may be omitted and the termination resistor Rtt may represent a resistance between the voltage node and the input-output pad PADS when the NMOS transistor TN2 is turned on.

In case of the termination circuit 92 of the second POD termination scheme in FIG. 18A, the high voltage level VIH and the low voltage level VIL of the input signal SI may be represented as FIG. 18B. The second power supply voltage VSSQ may be assumed to be a ground voltage (i.e., VSSQ=0) and the voltage drop along the transmission line TL may be neglected. Thus, the high voltage level VIH, the low voltage level VIL and the optimal reference voltage VREF may be calculated according to Expression3.

$$VIH = VDDQ,$$

$$VIL = VDDQ*RON/(RON+Rtt),$$

$$VREF = (VIH+VIL)/2 = VDDQ*(2RON+Rtt)/2(RON+Rtt) \qquad \text{Expression 3}$$

As such, the ODT circuit according to at least one exemplary embodiment of the inventive concept may adopt various termination schemes. In an exemplary embodiment, a training process is performed to obtain the optimal reference voltages VREF according to Expression1, Expression2 and Expression3. In an exemplary embodiment, the memory controller considers the ODT resistors of the non-target memory ranks that are enabled continuously to adjust the resistance value of the ODT circuit in the memory controller or the turn-on resistance value of the transmission driver in the memory controller.

FIGS. 19A and 19B are diagrams for describing a mode register for ODT according to exemplary embodiments of the inventive concept.

Information associated with controlling an ODT may be stored in an associated portion of the mode register 212 in FIG. 7A. For example, the associated portion of the mode register 212 may have a mode register set MRSET as illustrated in FIGS. 19A and 19B. A portion of values of operands OP0~OP7 may indicate information on resistance values of the ODT circuit.

FIG. 19A shows a value ODT for commonly controlling the resistance value of the ODT circuits in the target memory rank and the non-target memory rank, which is stored in a mode register MR11 among a plurality of mode registers included in the mode register 212. For example, the mode register MR11 could be a twelfth mode register among the plurality of mode registers.

In FIG. 19A, a non-target ODT function is enabled when the operand OP3 has a logic high level. In an exemplary embodiment, the non-target ODT function of a memory rank within a memory chip is enabled when the memory chip enters into a power-down mode, a self-refresh power down mode, a deep sleep mode, a precharge/active stand-by mode, a write mode, a write first-in and first-out (FIFO) mode, a read mode, a read FIFO mode, a read DQ calibration mode, or a mode register write mode. A resistance value of a CA ODT circuit may be set based on the operands OP4~OP6.

FIG. 19B shows a value NT-ODT for controlling the resistance value of the ODT circuits in the non-target memory rank, which is stored in a mode register MR41 among a plurality of mode registers included in the mode register 212. For example, the mode register MR41 could be a forty second mode register among the plurality of mode registers.

The values ODT and NT-ODT may be provided from the memory controller 20 through a mode register write operation. The control code CCD may be provided based on the values ODT and NT-ODT. A resistance value of the ODT circuit in the non-target memory rank may be set based on the operands OP5~OP7. The operand OP4 is assigned for post package repair PPRE and RFU denotes unused operands. For example, the post package repair PPRE may allow the memory controller 20 to remap a faulty row of a memory device (e.g., MU1) to spare row.

Figures 20, 21:
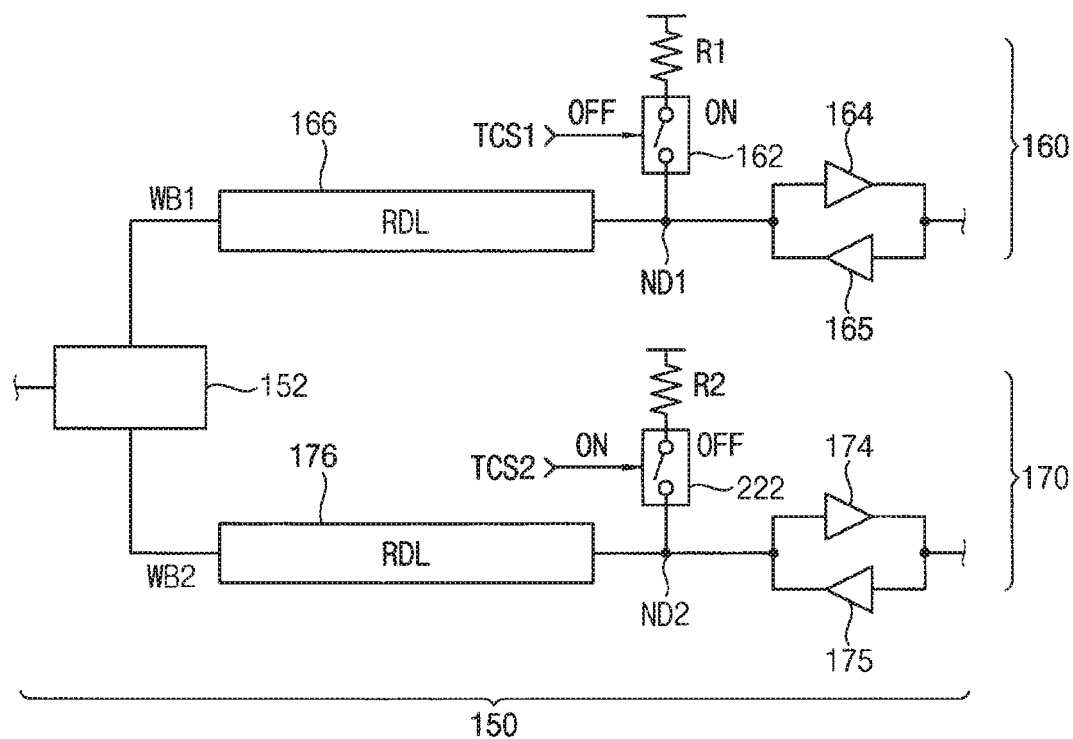
FIG. 20 shows an example of resistance values of the ODT circuit in a non-target memory rank, which is set based on the operands in FIG. 19B.
FIG. 21 illustrates connection of memory dies in a semiconductor memory device (e.g., a memory sub system) according to an exemplary embodiment of the inventive concept.

FIG. 20 shows an example of resistance values of the ODT circuit in the non-target memory rank, which is set based on the operands in FIG. 19B.

In FIG. 20, RZQ represents a unique resistance and may be 240 ohms (when a memory chip in the memory unit includes a DRAM) or 240 ohms (when a memory chip in the memory unit includes a flash memory). The RZQ may have a 1% margin of error. In an exemplary embodiment, RZQ is 240 ohms when a memory chip in the memory unit includes a DRAM and 300 ohms when a memory chip in the memory unit includes a flash memory. In an exemplary embodiment, RZQ is 300 ohms when a memory chip in the memory unit includes a DRAM and 240 ohms when a memory chip in the memory unit includes a flash memory. For example, as shown in FIG. 20, a default resistance value RTT could be set to RZQ/1, RZQ/2, RZQ/3, RZQ/4, RZQ/5, RZQ/6, etc.

FIG. 21 illustrates connection of memory dies in a semiconductor memory device (a memory sub system) according to an exemplary embodiment of the inventive concept.

Referring to FIG. 21, a semiconductor memory device 150 includes a first memory die 160 and a second memory die 170.

The first memory die 160 includes a first termination resistor R1 for an ODT. The first termination resistor R1 may be selectively connected to a first node ND1 based on a switching operation of a first termination connection switch 162. That is, the first termination resistor R1 is selectively connected to the first node ND1 based on a first termination control signal TCS1. The first node ND1 may be connected to a position of an input pad for receiving a signal. A first metal wire pattern 166 implemented with, for example, a redistribution layer RDL, may be formed between the first node ND1 and one end of a wire bonding WB1.

Accordingly, a receiving buffer 164 and a transmission buffer 165 of the first memory die 160 may be connected to the first node ND1 and may be placed at a center area of the first memory die 160 to transmit and receive a signal. A common metal pattern 152 may be disposed at the other end of the wire bonding WB1. That is, the common metal pattern 152 and the first metal wire pattern 166 may be connected using the wire bonding WB1. In this embodiment, for wire-bonding of the first memory die 160, the first metal wire pattern 166 may be a wire extending from a pad disposed at a center of a die to an edge of the first memory die 160.

The second memory die 170 includes a second termination resistor R2 for the ODT. The second termination resistor R2 may be selectively connected to a second node ND2 based on a switching operation of a second termination connection switch 222. That is, the second termination resistor R2 is selectively connected to the second node ND2 based on a second termination control signal TCS2. The second node ND2 may be connected to a position of an input pad for receiving a signal. A second metal wire pattern 176 implemented with, for example, a redistribution layer RDL, may be formed between the second node ND2 and one end of a wire bonding WB2.

Accordingly, a receiving buffer 174 and a transmission buffer 175 of the second memory die 170 may be connected to the second node ND2 and may be placed at a center area of the second memory die 170 to transmit and receive a signal. The common metal pattern 152 may be disposed at the other end of the wire bonding WB2. That is, the common metal pattern 152 and the second metal wire pattern 176 may be connected using the wire bonding WB2. In this embodiment, the second metal wire pattern 176 may be a wire extending from a pad disposed at a die center to an edge of a die for wire-bonding of the second memory die 170.

The first memory die 160 may correspond to a first memory rank and the second memory die 170 may correspond to a second memory rank.

As illustrated in FIG. 21, in a structure in which the first memory die 160 and the second memory die 170 are stacked, one signal line connected to the common metal pattern 152 may have a dual loading to perform an operation based on a dual-rank structure. For example, when a signal applied to one signal line is a command, the command may be transmitted to the common metal pattern 152 and may be transmitted to the first metal wire pattern 166 connected using the wire bonding WB1 and the second metal wire pattern 176 connected using the wire bonding WB2. Accordingly, the command may be simultaneously transmitted to the receiving buffer 164 of the first memory die 160 and the receiving buffer 174 of the second memory die 170.

Figure 22:
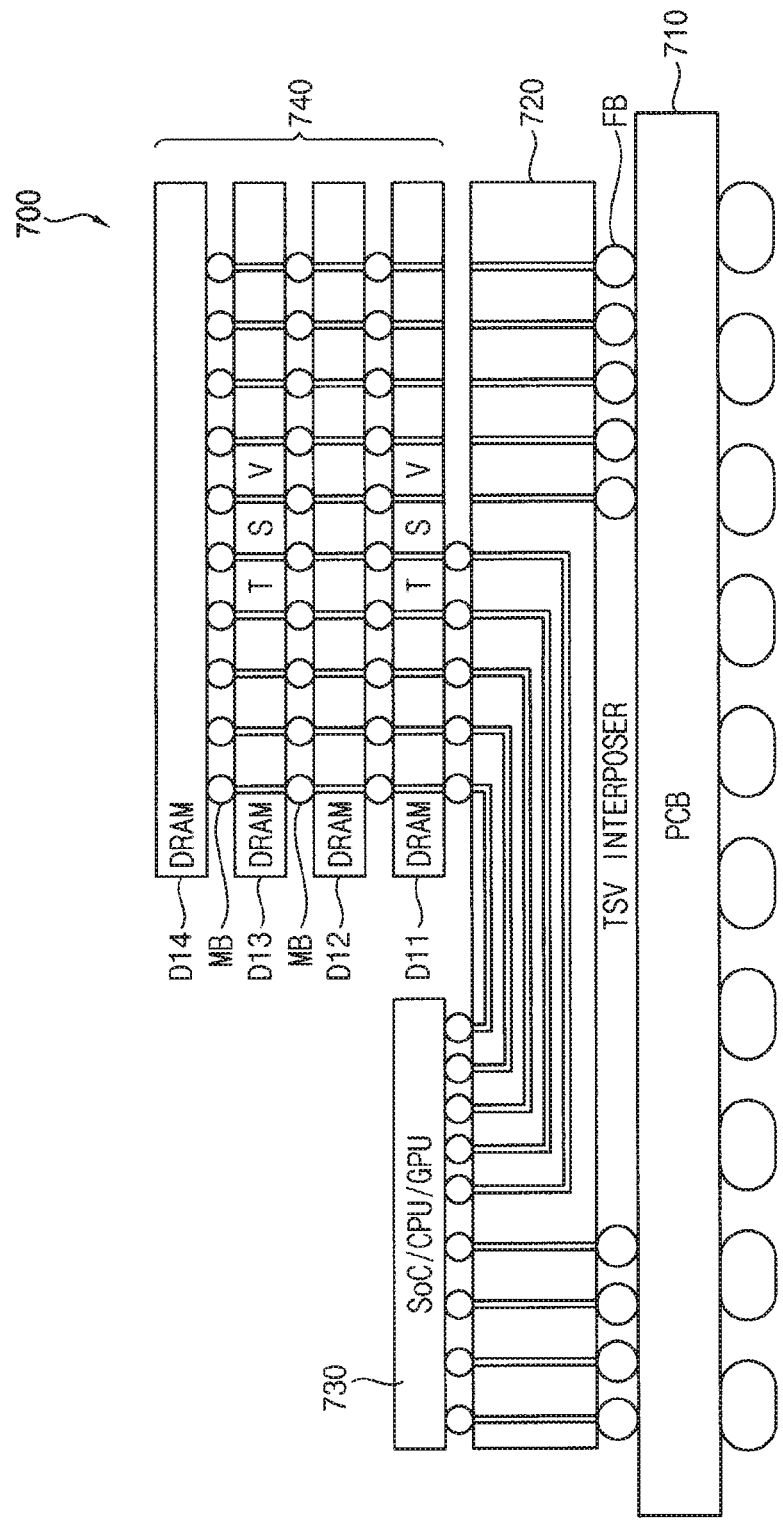
FIG. 22 is a cross-sectional view illustrating a 2.5 dimension (D) chip structure including a stacked memory device according to an exemplary embodiment of the inventive concept.

FIG. 22 is a cross-sectional view illustrating 2.5 dimension (D) chip structure including a stacked memory device according to an exemplary embodiment of the inventive concept.

Referring to FIG. 22, a 2.5 D chip structure 700 may be a chip structure in which a high bandwidth memory (HBM) 740 and a host die 730 are connected using an interposer layer 720. The HBM 740 includes memory dies D11~D14 and the host die functions as a controller (e.g., a memory controller).

The interposer layer 720 may be disposed on a printed circuit board (PCB) 710 and may be electrically connected to the PCB 710 through a flip chip bump FB. The flip chip bump FB may be made of a conductive material.

The host die 730 and the memory dies D11~D14 forming a structure of the HBM 740 may be stacked on the interposer layer 720. In FIG. 22, a buffer die or a logic die may be omitted. However, the buffer die or the logic die may be disposed between the memory die D11 and the interposer layer 720. To implement the structure of the HBM 740, through silicon via (TSV) lines may be formed in the memory dies D11~D14. The TSV lines may be electrically connected to micro-bumps MB formed between memory dies. Each of the memory dies D11~D14 may correspond to a memory rank. The micro-bumps MB may be made of a conductive material.

Figure 23:
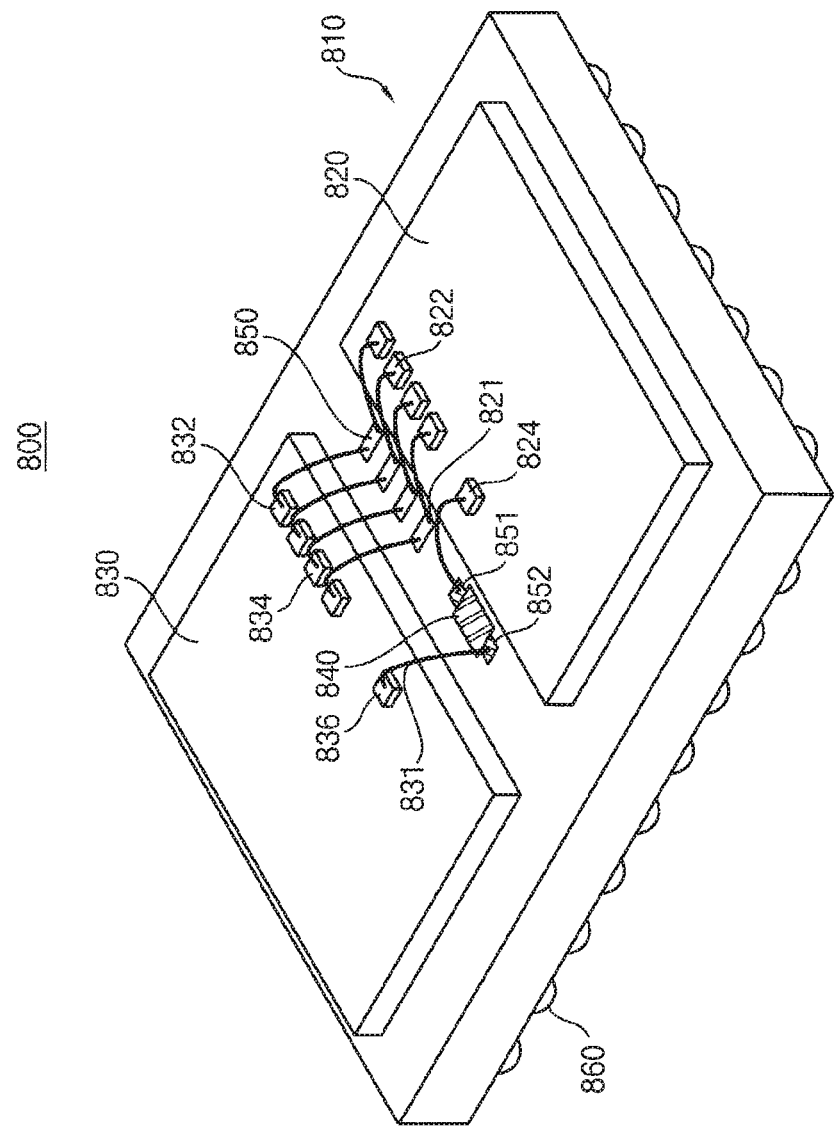
FIG. 23 is a perspective view illustrating a semiconductor package according to an exemplary embodiment of the inventive concept.

FIG. 23 is a perspective view illustrating a semiconductor package according to an exemplary embodiment of the inventive concept.

Referring to FIG. 23, the semiconductor package 800 includes a PCB 810, a resistor unit 840, an external connection terminal 860, a first semiconductor chip 820 and a second semiconductor chip 830. A first pad 851 and a second pad 852 may be formed on an upper surface of the PCB 810.

The first semiconductor chip 820 and the second semiconductor chip 830 may be mounted on the same plane of the PCB 810. The first semiconductor chip 820 and the second semiconductor chip 830 may be mounted on the PCB 810, for example, by a wire bonding method. Therefore, the semiconductor package 800 may include a first bonding wire 821 electrically connecting the first pad 851 of the PCB 810 to the first semiconductor chip 820, and a second bonding wire 831 connecting the second pad 852 of the PCB 810 to the second semiconductor chip 830. In some embodiments, the first semiconductor chip 820 and the second semiconductor chip 830 may be mounted on the PCB 810, for example, by a flip-chip bonding method.

The resistor unit 840 may be mounted on the PCB 810. The resistor unit 810 may include a plurality of connection terminals including a first connection terminal and a second connection terminal. The first connection terminal of the resistor unit 840 is connected to the first pad 851 on the PCB 810. The second connection terminal of the resistor unit 840 may be connected to the second pad 852 on the PCB 810.

The first semiconductor chip 820 and the second semiconductor chip 830 may correspond to a first memory chip and a second memory chip, respectively, corresponding to different memory ranks.

Figure 24:
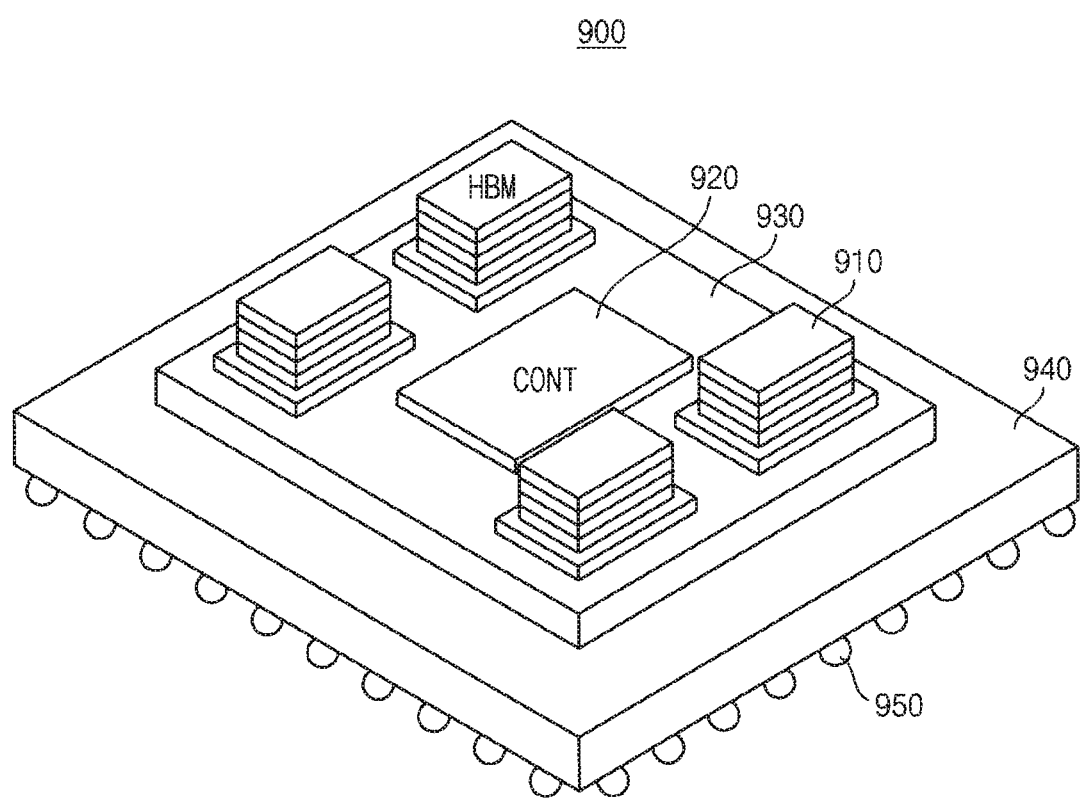
FIG. 24 is a diagram illustrating a semiconductor package including a stacked memory device according to an exemplary embodiment of the inventive concept.

FIG. 24 is a diagram illustrating a semiconductor package including a stacked memory device according to an exemplary embodiment of the inventive concept.

Referring to FIG. 24, a semiconductor package 900 includes one or more stacked memory devices 910 and a memory controller (CONT) 920.

The stacked memory devices 910 and the memory controller 920 may be mounted on an interposer 930, and the interposer on which the stacked memory devices 910 and the memory controller 920 are mounted may be mounted on a package substrate 940. The memory controller 920 may be implemented by the memory controller 20 in FIG. 1.

Each of the stacked memory devices 910 may be implemented in various forms, and may be a memory device in HBM form in which a plurality of layers are stacked. Accordingly, each of the stacked memory devices 910 may include a buffer die and a plurality of memory dies and each of the memory dies may include a memory cell array and an ODT circuit connected to a data I/O pin.

Therefore, each of the stacked memory devices 910 or each of the memory dies in the stacked memory devices 910 may be identified as a target memory rank and non-target memory rank in a write operation and a read operation. In an exemplary embodiment, a resistance value of the ODT circuit of the non-target memory rank is set to have a first resistance value in the write operation, a resistance value of the ODT circuit of the non-target memory rank is set to have a second resistance value different from the first resistance value in the read operation, and thus may enhance performance.

The plurality of stacked memory devices 910 may be mounted on the interposer 930, and the memory controller 920 may communicate with the plurality of stacked memory devices 910.

For example, each of the stacked memory devices 910 and the memory controller 920 may include a physical region, and communication may be performed between the stacked memory devices 910 and the memory controller 920 through the physical regions. Meanwhile, when each of the stacked memory devices 910 includes a direct access region, a test signal may be provided to each of the stacked memory devices 910 through conductive means (e.g., solder balls 950) mounted under package substrate 940 and the direct access region.

Embodiments of the present inventive concept may be applied to various systems including multi memory ranks. For example, the present inventive concept may be applied to systems such as a memory card, a mobile phone, a smart phone, a personal digital assistant (PDA), a portable multimedia player (PMP), a digital camera, a camcorder, personal computer (PC), a server computer, a workstation, a laptop computer, a digital TV, a set-top box, a portable game console, etc.

The foregoing is illustrative of exemplary embodiments of the inventive concept and is not to be construed as limiting thereof. Although a few example embodiments have been described, those skilled in the art will readily appreciate that many modifications are possible in the exemplary embodiments without materially departing from the present inventive concept.

What is claimed is:

1. A method of controlling on-die termination (ODT) in a memory system including a plurality of memory units that shares a data bus to exchange data, the method comprising:

enabling ODT circuits of the plurality of memory units into an initial state;

setting a resistance value of the ODT circuit of a non-target memory unit among the plurality of memory units to a first resistance value during a write operation on a target memory unit among the plurality of memory units; and setting a resistance value of the ODT circuit of a non-target memory unit among the plurality of memory units to a second resistance value during a read operation on a target memory unit among the plurality of memory units, wherein the first and second resistance values are the same when a current mode of the memory system is a first mode, and the first and second resistance values are different when the current mode is a second other mode.

2. The method of claim 1, wherein:

the plurality of memory units include a plurality of memory ranks which are individually selected based on a plurality of chip selection signals, respectively; and each of the plurality of memory ranks includes at least one memory chip.

3. The method of claim 2, wherein each of the plurality of memory units shares one channel including the data bus and a command/address bus.

4. The method of claim 1, wherein:
the plurality of memory units include a plurality of memory chips which are individually selected based on a plurality of chip selection signals, respectively; and
each of the plurality of memory chips includes a non-volatile memory chip.

5. The method of claim 1, wherein the plurality of memory units are stacked on a substrate and connected to the substrate through a wire-bond or a through silicon via.

6. The method of claim 1, wherein each of the plurality of memory units includes a mode register configured to set a resistance value of the respective ODT circuit.

7. The method of claim 1, further comprises:
disabling the ODT circuit of the non-target memory unit during one of the write operation and the read operation when the current mode is a third mode.

8. The method of claim 1, wherein when the current mode is the second mode, the first resistance value is 120 ohms and the second resistance value is 90 ohms.

9. The method of claim 1, wherein each of the ODT circuits of the plurality of memory units includes a plurality of pull-up termination resistors connected between a power supply voltage and a data input/output (I/O) pin.

10. The method of claim 1, wherein when the current mode is the second mode,
the first resistance value is RZQ/2 and the second resistance value is RZQ/4;
RZQ corresponds to a unique resistance of each of the ODT circuits of the plurality of memory units; and
RZQ is one of 240 ohms and 300 ohms and has a 1% margin of error.

11. The method of claim 1, wherein:
the plurality of memory units include a first memory rank and a second memory rank which are individually selected based on a first chip selection signal and a second chip selection signal, respectively;
the first memory rank includes at least a first memory chip;
the second memory rank includes at least a second memory chip;
the first memory rank is designated as a target memory rank in response to the first chip selection signal;
the second memory rank is designated as a non-target memory rank in response to the second chip selection signal;
a twelfth mode register among a plurality of mode registers in the second memory rank is configured to set a non-target ODT function of the second memory rank;
a forty-second mode register among the plurality of mode registers in the second memory rank is configured to set a resistance value of the ODT circuit of the second memory rank; and
the non-target ODT function of the second memory rank is enabled when the at least one second memory chip enters into a power-down mode, a self-refresh power down mode, a deep sleep mode, a precharge/active stand-by mode, a write mode, a write first-in and first-out (FIFO) mode, a read mode, a read FIFO mode, a read DQ calibration mode, or a mode register write mode.

12. The method of claim 1, wherein the target memory unit of the write or read operation is converted from a power-down mode to a normal operation mode to perform the corresponding operation, and the non-target memory unit maintains the power-down mode during the corresponding write operation or the read operation.

13. The method of claim 1, wherein:
each of the plurality of memory units includes a mode register configured to set a resistance value of the respective ODT circuit; and
the mode register in the non-target memory unit is configured to store the first resistance value and the second resistance value separately.

14. A memory system comprising:
a plurality of memory ranks sharing a data bus and a command/address bus; and
a memory controller configured to control the plurality of memory ranks,
wherein on die termination (ODT) circuits of the plurality of memory ranks are enabled into an initial state;
wherein a resistance value of the ODT circuit of a non-target memory rank among the plurality of memory ranks is set to a first resistance value during a write operation on a target memory rank among the plurality of memory ranks; and
wherein a resistance value of the ODT circuit of a non-target memory rank among the plurality of memory ranks is set to a second resistance value during a read operation on a target memory rank among the plurality of memory ranks,
wherein the first and second resistance values are the same when a current mode of the memory system is a first mode, and the first and second resistance values are different when the current mode is a second mode.

15. The memory system of claim 14, wherein:
the plurality of memory ranks are individually selected based on a plurality of chip selection signals, respectively; and
each of the plurality of memory ranks includes at least one memory chip.

16. The system of claim 14, wherein each of the plurality of memory ranks includes a mode register configured to set a resistance value of the respective ODT circuit, and
wherein the mode register in the non-target memory rank, of the plurality of mode registers, is configured to:
set the ODT circuit of the non-target memory unit to be disabled during one of the write operation being performed and the read operation being performed in a third mode among the plurality of modes.

17. The memory system of claim 14, wherein when the current mode is the second mode, the first resistance value corresponds to 120 ohms and the second resistance value corresponds to 90 ohms.

18. A memory system comprising:
a first memory rank and a second memory rank sharing a data bus and a command/address bus; and
a memory controller configured to control the first memory rank and the second memory rank,
wherein the first memory rank includes a first dynamic random access memory (DRAM) chip and the second memory rank includes a second DRAM chip;
wherein on die termination (ODT) circuits of the first and second DRAM chips are enabled into an initial state;
wherein a resistance value of the ODT circuit of the second DRAM chip corresponding to a write non-target of the first and second DRAM chips is set to a first resistance value during a write operation on the first DRAM chip corresponding to a write target of the first and second DRAM chips; and
wherein a resistance value of the ODT circuit of the second DRAM chip is set to a second resistance value different from the first resistance value during a read operation on the first DRAM chip.

19. The memory system of claim 18, wherein:

the resistance value of the ODT circuit of the second DRAM chip is changed from a default resistance value corresponding to the initial state to the first resistance value during the write operation on the first DRAM chip; and the resistance value of the ODT circuit of the second DRAM chip is changed from the second resistance value to the second resistance value during the read operation on the first DRAM chip.

* * * * *